United States Patent [19]

Kizuki

[11] Patent Number: 5,679,962
[45] Date of Patent: Oct. 21, 1997

[54] SEMICONDUCTOR DEVICE AND A SINGLE ELECTRON DEVICE

[75] Inventor: Hirotaka Kizuki, Itami, Japan

[73] Assignee: Mitsubishi Denki Kabushiki Kaisha, Tokyo, Japan

[21] Appl. No.: 452,090

[22] Filed: May 26, 1995

[30] Foreign Application Priority Data

May 31, 1994 [JP] Japan .................. 6-118613

[51] Int. Cl.$^6$ ............ H01L 29/06; H01L 31/0328; H01L 31/0336
[52] U.S. Cl. .................. 257/17; 257/20; 257/22; 257/23; 257/24; 257/25; 257/194; 257/472; 257/476
[58] Field of Search .................. 257/476, 472, 257/473, 194, 192, 17, 22, 20, 23, 24, 25

[56] References Cited

U.S. PATENT DOCUMENTS

| | | | |
|---|---|---|---|
| 4,872,038 | 10/1989 | Bernstein et al. | 257/20 |
| 5,198,879 | 3/1993 | Ohshima | 257/20 |
| 5,475,237 | 12/1995 | Narui et al. | 257/22 |
| 5,512,762 | 4/1996 | Suzuki et al. | 257/17 X |

FOREIGN PATENT DOCUMENTS

| | | | |
|---|---|---|---|
| 0336172 | 10/1989 | European Pat. Off. | 257/20 |
| 1270279 | 10/1989 | Japan . | |
| 2134830 | 5/1990 | Japan . | |
| 4199519 | 7/1992 | Japan . | |
| 2285175 | 6/1995 | United Kingdom . | |

OTHER PUBLICATIONS

No Author, "One–Dimensional Flow Electron Gas Semiconductor Device", *IBM Technical Disclosure Bulletin*, vol. 29, No. 10, Mar. 1987, pp. 4398–4399.

Sakaki, "Quantum Wire Superlattices And Coupled Quantum Box Arrays: A Novel Method To Suppress Optical Phonon Scattering In Semiconductors", Japanese Journal of Applied Physics, vol. 28, No. 2, Feb. 1989, pp. L314–L316.

Arakawa et al, "Multidimensional Quantum Well Laser And Temperature Dependence Of Its Threshold Current", Applied Physics Letters, vol. 40, No. 11, Jun. 1982, pp. 939–941.

Sakaki, "Scattering Suppression And High–Mobility Effect Of Size–Quantized Electrons In Ultrafine Semiconductor Wire Structures", Japanese Journal of Applied Physics, vol. 19, No. 12, Dec. 1980, pagers L735–L738.

H. Sakaki, "Turnstyle Operation Of A Dot Device With A Side Gate", Proceedings of the Symposoum Sakaki Quantum Wave Project, 1993, pp. 201–202 (with abstract).

*Primary Examiner*—William Mintel
*Attorney, Agent, or Firm*—Leydig, Voit & Mayer, Ltd.

[57] ABSTRACT

A semiconductor device includes a semi-insulating semiconductor substrate, a semiconductor layer structure including at least an undoped layer of a first semiconductor, an undoped spacer layer of a second semiconductor having an electron affinity smaller than that of the first semiconductor, and an n type electron supply layer of the second semiconductor successively laminated on the substrate, the undoped layer having a flat top surface and a flat rear surface on the flat top surface of the undoped spacer layer, having, at a top surface, a concavo-convex periodic structure, and a flat rear surface, the n-type electron supply layer of the second semiconductor having a flat top surface and a rear surface that buries concavities of the concavo-convex structure of the undoped spacer layer, and a plurality of periodically arranged Schottky electrodes on the flat top surface of the n type electron supply layer, arranged in a direction perpendicular to the concavo-convex periodic structure of the undoped spacer layer.

22 Claims, 22 Drawing Sheets

[100]
[0$\bar{1}$1]   [011]

(0$\bar{1}$1) cross section (011) cross section position

Fig.12 (a)

truth value table of AND gate

| A | B | X |
|---|---|---|
| 0 | 0 | 0 |
| 1 | 0 | 0 |
| 0 | 1 | 0 |
| 1 | 1 | 1 |

Fig.12 (b)

truth value table of OR gate

| A | B | X |
|---|---|---|
| 0 | 0 | 0 |
| 0 | 1 | 1 |
| 1 | 0 | 1 |
| 1 | 1 | 1 |

(0$\bar{1}$1) cross section (011) cross section (0$\bar{1}$1) cross section (011) cross section (0$\bar{1}$1) cross section (011) cross section (0$\bar{1}$1) cross section (011) cross section

SEMICONDUCTOR DEVICE AND A SINGLE ELECTRON DEVICE

FIELD OF THE INVENTION

The present invention relates to a semiconductor device forming a quantum wire superlattice, a fabricating method thereof, a single electron device, and a fabricating method thereof and, more particularly, to a new structure for obtaining a good quality quantum wire superlattice and a quantum box, a fabricating method thereof, a new structure for obtaining a single electron device that is operational at room temperature, and a fabricating method thereof.

BACKGROUND OF THE INVENTION

With remarkable developments in material science and crystalline growth techniques, fabrication of a semiconductor structure controlled to an atomic scale has been enabled as has observation and control of physical phenomena that occur in that semiconductor structure. Such a semiconductor structure controlled to an atomic scale is called a semiconductor fine structure, and there has been shown a possibility that these semiconductor fine structures can be applied to high performance laser diodes (LDs) (Y. Arakawa and H. Sakaki, Applied Physics Letters, Volume 40, (1982) page 939). Therefore, many endeavors for realizing this possibility have been diligently pursued.

A high mobility electron is obtained in a quantum wire. When charge carriers in a quantum wire are subjected to elastic scattering, such as impurity scattering, it is necessary that the energy of the atoms in the quantum wire be conserved before and after the scattering. In a one-dimensional quantum wire, only forward scattering from momentum $K_F$ to momentum $K_F$ or backward scattering from momentum $K_F$ to momentum $-K_F$ is allowed. Because the probability of scattering having a large momentum change, such as backward scattering, is quite low, however, when the impurity density in the channel is low, hardly any elastic scattering occurs. As a result, a high electron mobility is realized, particularly at a low temperature. There is a problem, however, that non-elastic scattering cannot be suppressed in a quantum wire. When the temperature of a sample is higher than approximately 10° K., electrons are subjected to optical phonon scattering, and mobility is reduced. If device applications are taken into consideration, in order to obtain a high mobility at room temperature, similar to that at low temperature, suppression of scattering of optical phonons is necessary. Sakaki theoreticized that not only the elastic scattering but also the optical phonon scattering can be suppressed by employing a unique quantum wire superlattice structure (H. Sakaki: Japanese Journal of Applied Physics, Volume 28, (1989) page L314).

FIG. 16(a) is a conceptual diagram illustrating a quantum wire superlattice. The quantum wire superlattice is a structure in which a plurality of quantum boxes are arranged one-dimensionally and respective quantum boxes are connected with each other through tunneling. In this structure, the state density of electrons is shown in FIG. 16(b). In the figure, the ordinate represents state density and the abscissa represents energy. In addition, n=1 represents state density at the bottom mini band and n=2 represents the state density at the first excited mini band, respectively. It is assumed here that all the electrons are contained in the bottom mini band, that the bandwidth of the bottom mini band is $E_b$, and that the band gap energy between the bottom mini band and the first excited mini band is $E_g$. In addition, the energy given and received by the phonon scattering is assumed to be $h\omega_{op}/2\pi$. If it is supposed that $E_b$ is smaller than $h\omega_{op}/2\pi$, scattering due to loss and reception of phonons is inhibited in the bottom mini band. Further, when $E_g$ is larger than $h\omega_{op}/2\pi$, an interband transition due to losing and receiving phonons is inhibited. Accordingly, almost all scattering processes in the crystal are inhibited when the two conditions of $E_b<h\omega_{op}/2\pi$ and $E_g>h\omega_{op}/2\pi$ in the quantum wire superlattice structure are satisfied, whereby a quite high mobility is realized even at room temperature. These conditions are realized where respective quantum boxes have sizes of approximately 20 nm along each edge and respective quantum boxes are connected weakly with each other.

In order to realize a quantum wire superlattice, it is necessary to fabricate a fine structure with high controllability, suppressing processing damage and vacancies. The fabrication of a quantum well structure employing FIB (focused ion beam) or RIE (reactive ion etching) is impossible because it is impossible to suppress processing damage. There has been no report of fabricating a good quantum wire superlattice because of these difficulties.

In addition, attempts at creating devices having new functions by controlling tunneling of electrons, one-by-one, in a semiconductor fine structure and applying the same to devices have been tried, thereby forming the new field of single electron devices. The physical phenomenon called a "Coulomb Blockade", one of the fundamental operation principles of a single electron device, will be described. When a semiconductor has a potential barrier that is quite thin, an electron can tunnel through the potential barrier with a constant probability on the basis of its wave motion property. Generally, in a tunneling junction, because a large quantity of tunneling electrons exist, although it is possible to control the mean value of the tunneling current, it is impossible to control whether each of the electrons tunnels. However, when the size of the junction is so small that the electrostatic capacitance of the junction cannot be ignored as compared with the elementary charge e, tunneling of an electron can be controlled under prescribed conditions.

Generally, the electrostatic energy of a tunneling junction is represented by the following formula:

$$E=Q^2/2C \quad (J) \tag{1}$$

where E represents an electrostatic energy, Q represents the electronic charge, and C represents capacitance, respectively. Assuming that an electron tunnels through this junction, the change in the electrostatic energy in front of and behind the junction is as follows:

$$\Delta=(Q-2)^2/2C-Q^2/2C=e/C(e/2-Q) \tag{2}$$

From formula (2), when Q<e/2, as long as no energy is supplied from the outside, tunneling of an electron is inhibited. This phenomenon is called a "Coulomb Blockade" In order to observe the Coulomb Blockade, the Coulomb energy of an electron is required to be large relative to the background thermal noise $k_BT$ ($k_B$ is Boltzman's constant). If it is supposed that the junction is about 100 nm×100 nm, the Coulomb Blockade can be observed at a temperature below 1° K. In order to observe the Coulomb Blockade at room temperature, the size of the junction has to be reduced to about 20 nm×20.

FIGS. 17(a) and 17(b) are a plan view and a perspective view, respectively, of a prior art single electron device. As shown in those figures, this device is formed by etching the conventional two-imensional electron gas structure employing AlGaAs/GaAs into a ridge, fabricating a quasionedimensional channel (hereinafter referred to as Quasi-1DEG)

directly under the ridge, and arranging two top gates (Gate 1, Gate 2) and a side gate (Side Gate) as shown in the figures. The side gate is provided to control the effective width of the quasi-one-dimensional channel. By applying an appropriate voltage to the two top gates, some electrons in the one-dimensional channel are confined in the region between the two top gates, whereby a quantum dot is produced.

FIG. 18 shows I–V characteristics between a source and a drain obtained when the voltage applied to the two top gates is set to a voltage so that an electron scarcely can tunnel between the two top gates and when a voltage having a high frequency (f=10 MHz) is additionally applied while shifting its phase by π. From the characteristics shown in the figure, it is confirmed that the current I as a function of the bias voltage is quantized, each of which is represented by a formula $I=n_{ef}$, and that the electrons are sequentially carried, one-by-one, between the source and the drain. From this experiment, the present device utilizing the Coulomb Blockade can be utilized to obtain a standard current.

However, this experiment has been carried out at an extremely low temperature, 10° mK., which suggests that there will be many problems to be solved when applying this operation to actual devices. It is thought that making the size of the dot sufficiently small enables realization of a single electron device operating even in a practical temperature region and the most important problem present in realizing the single electronic device is how to realize a very small size junction with good crystalline quality.

SUMMARY OF THE INVENTION

It is an object of the present invention to provide a semiconductor device for obtaining a high quality quantum wire superlattice.

It is another object of the present invention to provide a method for fabricating the semiconductor device.

Still another object of the present invention is to provide a single electron device operating even at room temperature.

Still another object of the present invention is to provide a method for fabricating the single electron device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor device includes a semi-insulating semiconductor substrate having a top surface and a rear surface, a semiconductor layer structure comprising at least an undoped layer of a first kind of semiconductor having a top surface and a rear surface, an undoped spacer layer comprising a second kind of semiconductor having an electron affinity smaller than the first kind of semiconductor, a top surface, and a rear surface, and an n type electron supply layer comprising the second kind of semiconductor having a top surface and a rear surface, successively laminated on the top surface of the semi-insulating semiconductor substrate, the undoped layer having a flat top surface and a flat rear surface, the undoped spacer layer having a concavo-convex periodic structure as the top surface and having a flat rear surface on the flat top surface of the undoped spacer layer, the n type electron supply layer having a flat top surface and the rear surface burying the concavities formed of the top surface of the undoped spacer layer, and a plurality of Schottky electrodes on the flat top surface of the n type electron supply layer, arranged periodically in a direction perpendicular to the periodic structure of the upper surface of the undoped spacer layer. The quantum wire superlattice can be realized by confining electrons in the periodic structure by applying a periodic voltage to the Schottky electrodes.

According to a second aspect of the present invention, in the semiconductor device, the semiconductor substrate is GaAs, the first kind of semiconductor is GaAs, and the second kind of semiconductor is AlGaAs.

According to a third aspect of the present invention, in the semiconductor device, the semiconductor substrate is GaAs, and the semiconductor layer structure comprises at least an undoped InGaAs layer as the first kind of semiconductor, an undoped AlGaAs spacer layer, and an n type AlGaAs electron supply layer.

According to a fourth aspect of the present invention, in the semiconductor device, the semiconductor substrate is GaAs, and the semiconductor layer structure comprises at least an undoped GaAs layer, an undoped InGaAs layer as the first kind of semiconductor, an undoped AlGaAs spacer layer, and an n type AlGaAs electron supply layer.

According to a fifth aspect of the present invention, in the semiconductor device, the semiconductor substrate is InP, the first kind of semiconductor is InGaAs, and the second kind of semiconductor is AlInAs.

According to a sixth aspect of the present invention, in the semiconductor device, the semiconductor substrate is InP, and the semiconductor layer structure comprises at least an undoped InGaAs layer as the first kind of semiconductor, an undoped AlInAs spacer layer, and an n type AlInAs electron supply layer.

According to a seventh aspect of the present invention, in the semiconductor device, the semiconductor substrate is InP, and the semiconductor layer structure comprises at least an undoped AlInAs layer, an undoped InGaAs layer as the first kind of semiconductor, an undoped AlInAs spacer layer, and an n type AlInAs electron supply layer.

According to an eighth aspect of the present invention, in the semiconductor device, the semiconductor substrate is InP, and the semiconductor layer structure comprises at least an undoped AlInAs layer, an undoped InGaAs layer as the first kind of semiconductor, an undoped AlInAs spacer layer as the second kind of semiconductor, and an n type AlInAs electron supply layer, and an undoped AlInAs cap layer, successively laminated.

According to a ninth aspect of the present invention, in the semiconductor device, the cross-section of the periodic structure of the undoped spacer layer has a triangular configuration.

According to a tenth aspect of the present invention, in the semiconductor device, the sloped surface of the periodic structure of the undoped spacer layer comprises a (111)B surface.

According to an eleventh aspect of the present invention, in the semiconductor device, the cross-section of the periodic structure of the undoped spacer layer has a depth that varies periodically along the length direction.

According to a twelfth aspect of the present invention, a method for fabricating a semiconductor device including a semi-insulating semiconductor substrate having a top surface and a rear surface, a semiconductor layer structure comprising at least an undoped layer of a first kind of semiconductor having a top surface and a rear surface, an undoped spacer layer comprising a second kind of semiconductor having an electron affinity smaller than the first kind of semiconductor, a top surface, and a rear surface, and an n type electron supply layer comprising the second kind of semiconductor having a top surface and a rear surface, successively laminated on the top surface of the semi-insulating semiconductor substrate, the undoped layer having flat top and rear surfaces, the undoped spacer layer having a concavo-convex periodic structure in the top surface and a flat rear surface on the top surface of the undoped spacer layer, the n type electron supply layer having a flat top surface and a rear surface burying concavities of the undoped spacer layer, and a plurality of Schottky electrodes on the top surface of the n type electron supply layer, arranged perpendicular to the concavo-convex periodic structure, the method including growing at least the undoped layer and the undoped spacer layer on the semi-insulating semiconductor substrate; processing the undoped spacer layer to produce the concavo-convex periodic structure; forming the n type electron supply layer burying the concavo-convex periodic structure; and forming a plurality of Schottky electrodes on the upper surface of the semiconductor layer structure arranged periodically in a direction perpendicular to the concavo-convex periodic structure of the undoped spacer layer.

According to a thirteenth aspect of the present invention, in the fabrication method, the process of processing the undoped spacer layer includes cleaning the undoped spacer layer at a temperature of less than 450° C. in a mixture of an etching gas that etches the second kind of semiconductor, a Group V gas, and hydrogen, and then etching at a temperature of more than 450° C. in a mixture of an etching gas that etches the second kind of semiconductor, a Group V gas, and hydrogen. Therefore, the periodic structure can be fabricated with high precision.

According to a fourteenth aspect of the present invention, the fabrication method of a semiconductor device includes forming a GaAs cap layer on the undoped spacer layer comprising the second kind of semiconductor after forming the AlGaAs layer; and the processing of the undoped spacer layer comprises surface cleaning of the GaAs cap layer at a temperature less than 450° C. in a mixture including an etching gas that etches AlGaAs, a Group V gas, and hydrogen; and gas etching the GaAs cap layer and the undoped spacer layer at a temperature of more than 450° C. in a mixture including an etching gas that etches GaAs and AlGaAs, a Group V gas, and hydrogen. Therefore, the concavo-convex periodic structure can be fabricated with high precision.

According to a fifteenth aspect of the present invention, in the fabrication method, the etching gas that etches AlGaAs or AlInAs is selected from the group including a gas including chlorine, a gas including bromine, and a gas including iodine.

According to a sixteenth aspect of the present invention, in the fabrication method, the etching gas that etches AlGaAs as well as the GaAs cap layer is selected from a group including a gas including chlorine, a gas including bromine, and a gas including iodine.

According to a seventeenth aspect of the present invention, in the fabrication method, after forming the concavo-convex periodic structure of the spacer layer employing gas etching, the electron supply layer is grown in the same chamber or in a growth chamber connected with the chamber in which the gas etching occurs. Thereby, the spacer layer and the electron supply layer can be easily fabricated.

According to an eighteenth aspect of the present invention, a single electron device includes at least an undoped layer of a first kind of semiconductor, an undoped spacer layer comprising a second kind of semiconductor having a smaller electron affinity than the first kind of semiconductor, and an n type electron supply layer comprising the second kind of semiconductor, successively laminated, portions of the undoped spacer layer having reverse triangular configurations in cross-section at least at two locations, the n type electron supply layer burying regions of the undoped spacer layer that have reverse triangular configurations in cross-section; a plurality of gate electrodes disposed on the upper surface of the semiconductor layer structure arranged in a direction perpendicular to the cross-section including the reverse triangular configurations of the undoped spacer layer; and a source electrode and a drain electrode disposed on the upper surface of the semiconductor layer structure, opposite each other with the plurality of gate electrodes between the source and drain electrodes. A single electron or a plurality of electrons in electron storage regions in the undoped layer at edges of the reverse triangular configuration of the undoped spacer layer are switched by an application of a voltage to the gate electrodes, thereby enabling the operation of a single electron device.

According to a nineteenth aspect of the present invention, in the single electron device, gate voltages that make an electron scarcely tunnel directly below the gate electrodes are applied to the gate electrodes and high frequency voltages having a phase shift of π therebetween are applied to the gate electrodes, thereby enabling an electrons to be carried sequentially, one-by-one between the source electrode and the drain electrode in respective channels comprising the electron storage regions in the undoped layer.

According to a twentieth aspect of the present invention, in the single electron device, a first pair and a second pair of gate electrodes are provided so that respective pairs of gate electrodes cover a plurality of channels comprising electron storage regions in the undoped layer, providing an AND logic element in which, only when voltages are applied to both of the first and second pairs of gate electrodes at the same time, the path between the source electrode and the drain electrode enters a conductive state.

According to a twenty-first aspect of the present invention, in the single electron device, a first pair and a second pair of gate electrodes cover respective channels, providing an OR logic element in which, when a voltage is applied to one or both of the first and second pairs of gate electrodes, the path between respective source electrode and respective drain electrode enters a conductive state.

According to a twenty-second aspect of the present invention, in the single electron device, a pair of gate electrodes is disposed at respective channels comprising the electron storage regions in the undoped layer, providing a single electron device in which, having the source electrode and the drain electrode, transfers an M step current value as an information unit.

According to a twenty-third aspect of the present invention, in the single electron device, gate electrodes are provided for respective channels comprising the electron storage regions in the undoped layer, drain electrodes are provided independently for each of the respective channels, a common source electrode is provided for the gate electrodes and the drain electrodes, producing a single electron device in which an information transfer employing each of respective channels as one bit is enabled. According to a twenty-fourth aspect of the present invention, a single electron device includes a semi-insulating semiconductor substrate having a top surface and a rear surface; a semiconductor layer structure comprising at least an undoped layer of a first kind of semiconductor having a top surface and a rear surface, an undoped spacer layer comprising a second kind of semiconductor having an electron affinity smaller than the first kind of semiconductor, a top surface, and a rear surface, and an n type electron supply layer comprising the second kind of semiconductor, a top surface, and a rear surface, successively laminated on the top surface of the semi-insulating semiconductor substrate, portions of the undoped spacer layer having reverse triangular configurations in cross-section, the depth of the concave portion periodically varying along the length direction, thereby forming shallow regions at a plurality of locations, the electron supply layer burying the concavo-convex periodic structure of the undoped spacer layer; a plurality of gate electrodes disposed on the upper surface of the semiconductor layer structure, arranged in correspondence to shallow portions of the spacer layer; and a source electrode and a drain electrode disposed at regions confronting each other and with the gate electrodes between them, on the upper surface of the semiconductor layer structure.

According to a twenty-fifth aspect of the present invention, in the single electron device, the cross-section of the periodic structure of the undoped spacer layer has a triangular configuration.

According to a twenty-sixth aspect of the present invention, in the single electron device, the sloped surface of the periodic structure of the undoped spacer layer comprises a (111)B surface.

According to a twenty-seventh aspect of the present invention, in the single electron device, an undoped InGaAs layer, an undoped AlGaAs spacer layer, and an n type AlGaAs electron supply layer are disposed on the semi-insulating substrate comprising GaAs.

According to a twenty-eighth aspect of the present invention, the single electron device includes, successively laminated, at least an undoped GaAs layer, an undoped InGaAs layer of the first kind of semiconductor, an undoped AlGaAs spacer layer, and an n type AlGaAs electron supply layer disposed on the semi-insulating substrate comprising GaAs.

According to a twenty-ninth aspect of the present invention, the single electron device, successively laminated, at least an undoped AlInAs layer, an undoped InGaAs layer, an undoped AlInAs spacer layer, and an n type AlInAs electron supply layer disposed on a semi-insulating substrate comprising InP.

According to a thirtieth aspect of the present invention, a method of fabricating a single electron device including a semi-insulating semiconductor substrate having a top surface and a rear surface, a semiconductor layer structure comprising at least an undoped layer of a first kind of semiconductor having a top surface and a rear surface, an undoped spacer layer comprising a second kind of semiconductor having a smaller electron affinity than the first kind of semiconductor, a top surface, and a rear surface, and an n type electron supply layer comprising the second kind of semiconductor having a top surface and a rear surface, successively laminated on the top surface of the semi-insulating semiconductor substrate, the undoped layer having a flat top surface and a flat rear surface, the undoped spacer layer having a top surface with a concavo-convex periodic structure and a flat rear surface, the n type electron supply layer having a flat top surface and burying the concavities in the top surfaces of the undoped spacer layer, and a plurality of Schottky electrodes on the flat top surface of the n type electron supply layer, arranged in a direction perpendicular to the periodic structure of the undoped spacer layer, the method comprising growing a semiconductor layer structure comprising at least the undoped layer of a first kind of semiconductor and the undoped spacer layer of a second kind of semiconductor having a smaller electron affinity than the first kind of semiconductor, successively, on the semi-insulating semiconductor substrate; etching the undoped spacer layer to have reverse triangular configurations in cross-section at least at two points; forming the n type electron supply layer of the second kind of semiconductor burying regions of the undoped spacer layer that have reverse triangular configurations; forming a plurality of gate electrodes on the upper surface of the semiconductor layer structure arranged in a direction perpendicular to the cross-section including the reverse triangular configurations of the undoped spacer layer; and forming a source electrode and a drain electrode on the upper surface of the semiconductor layer structure, opposite each other and with the gate electrodes between them.

According to a thirty-first aspect of the present invention, a method of fabricating a single electron device produces a semi-insulating semiconductor substrate having a top surface and a rear surface, a semiconductor layer structure comprising at least an undoped layer of a first kind of semiconductor having a top surface and a rear surface, an undoped spacer layer comprising a second kind of semiconductor having an electron affinity smaller than the first kind of semiconductor, a top surface, and a rear surface, and an n type electron supply layer comprising the second kind of semiconductor having a top surface and a rear surface, successively laminated on the top surface of the semi-insulating semiconductor substrate, the undoped spacer layer having reverse triangular configurations in cross-section with a depth that varies periodically along a length direction, and an n type electron supply layer of the second kind of semiconductor burying the periodic structure of the undoped spacer layer; a plurality of gate electrodes on the upper surface of the semiconductor layer structure, at shallow portions of the spacer layer, and a source electrode and a drain electrode opposite each other with the gate electrodes between them on the upper surface of the semiconductor layer structure.

BRIEF DESCRIPTION OF THE DRAWINGS

FIGS. 12(a) and 12(b) are a truth table for explaining the operation of a single electron logic element according to the thirteenth embodiment of the present invention and a truth table for explaining the operation of a single electron logic element according to the fourteenth embodiment, respectively.

DETAILED DESCRIPTION OF THE PREFERRED EMBODIMENTS

Embodiment 1

Figure 1:
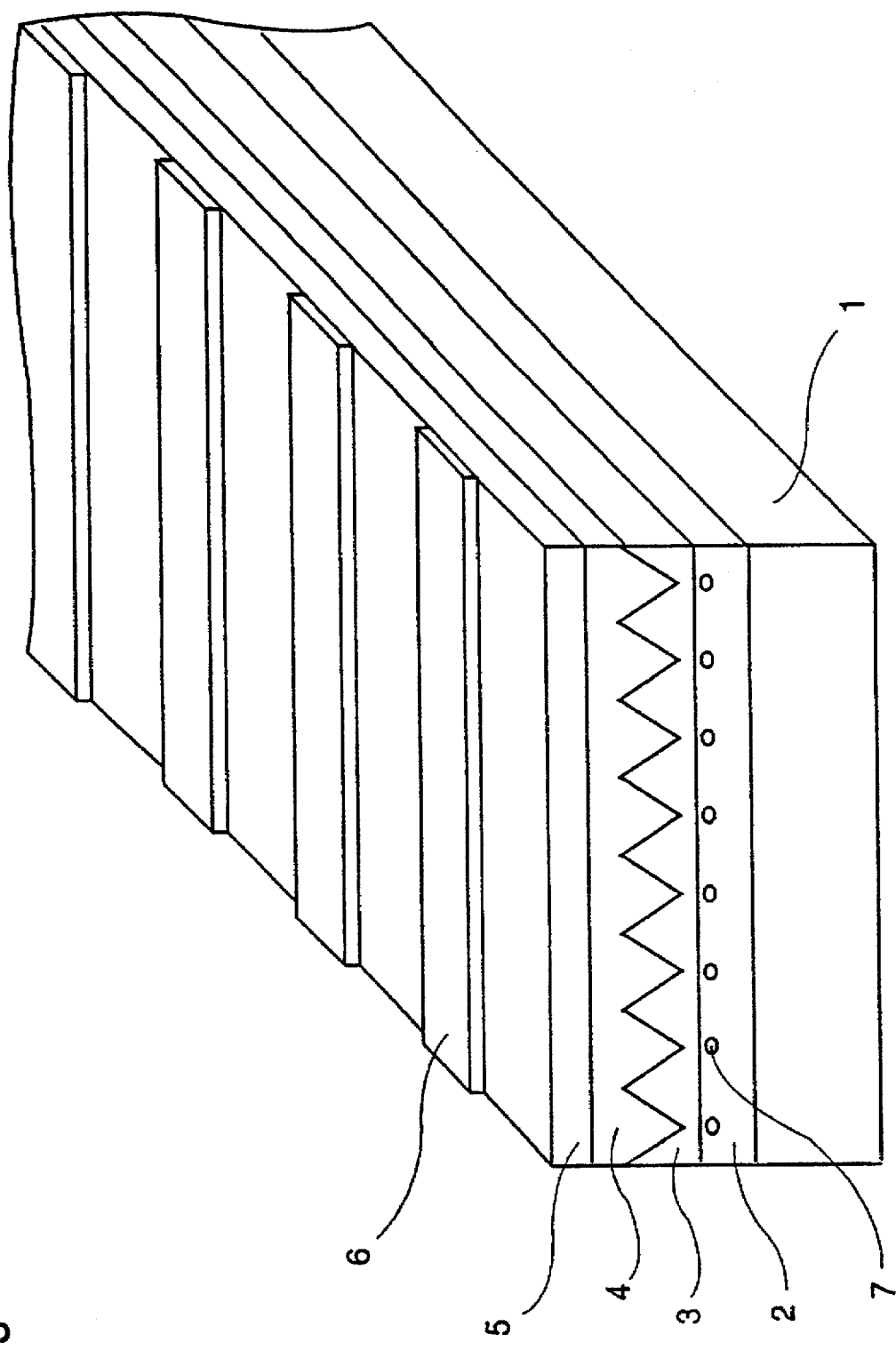
FIG. 1 is a perspective view illustrating a semiconductor device having a quantum wire superlattice structure according to a first embodiment of the present invention.

FIG. 1 is a perspective view illustrating a semiconductor device having a quantum wire superlattice structure according to a first embodiment of the present invention. In the figure, the device starts with a semi-insulating GaAs substrate. On the semi-insulating GaAs layer 1, an undoped GaAs layer 2 comprising GaAs as a first kind of semiconductor is disposed. On the undoped GaAs layer 2, an undoped $Al_{0.3}Ga_{0.7}As$ spacer layer 3, comprising AlGaAs as a second kind of semiconductor having a smaller electron affinity than GaAs is disposed. The undoped AlGaAs spacer layer 3 has a concavo-convex periodic structure 30 having a period of 25 nm at its surface. The thickness of the spacer layer 3 is 10 nm at the concave part and is 45 nm at the convex part. An n type $Al_{0.3}Ga_{0.7}As$ electron supply layer 4 comprising AlGaAs as the second kind of semiconductor is disposed on and buries the concavo-convex periodic structure 30 of the undoped AlGaAs spacer layer 3. The electron supply layer 4 is formed so that the sum of thicknesses of the spacer layer 3 and the electron supply layer 4 is 90 nm. An n type GaAs contact layer 5 is disposed on the n type AlGaAs electron supply layer 4. A Schottky electrode 6 comprising Ti/Pt/Au is disposed on the n type GaAs layer 5 extending along a direction perpendicular to the concavo-convex periodic structure 30. The width and separation of the Schottky electrodes 6 are both 25 nm. In other words, the electrodes have a period of 50 nm. Electron storage regions 7 are respectively formed at positions in the undoped GaAs layer 2 opposite the maximum thickness regions of the electron supply layer 4 of the concavo-convex periodic structure 30, i.e., the thinnest regions, of the undoped AlGaAs spacer layer 3.

As disclosed in Japanese Published Patent Application Hei. 4-199519, the introduction of a concavo-convex periodic structure having a reverse triangular cross-section at least for the concave part of that structure in an HEMT (high electron mobility transistor) structure provides a high quality quantum wire structure having electron storage layers of a sufficiently narrow width.

Figure 2:
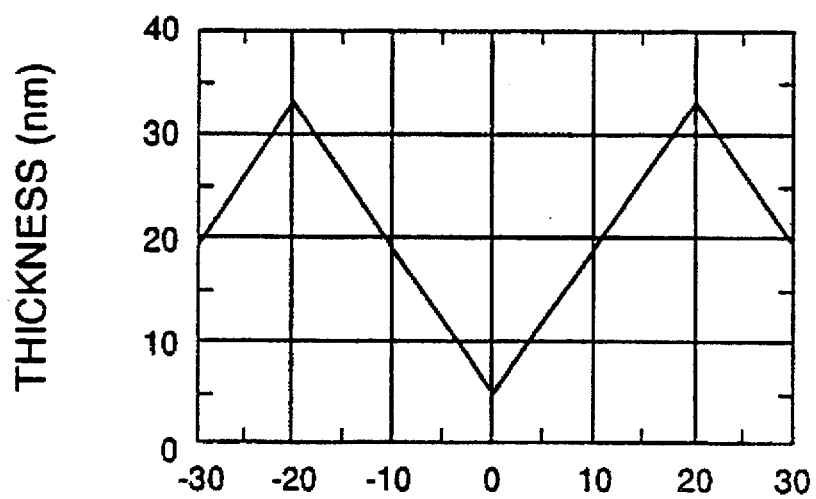
FIGS. 2(a), 2(b), and 2(c) are diagrams illustrating thickness, energy, and electron concentration relative to position, respectively, for explaining the principle by which a quantum wire superlattice structure according to the first embodiment of the present invention is formed.
Figure 2:
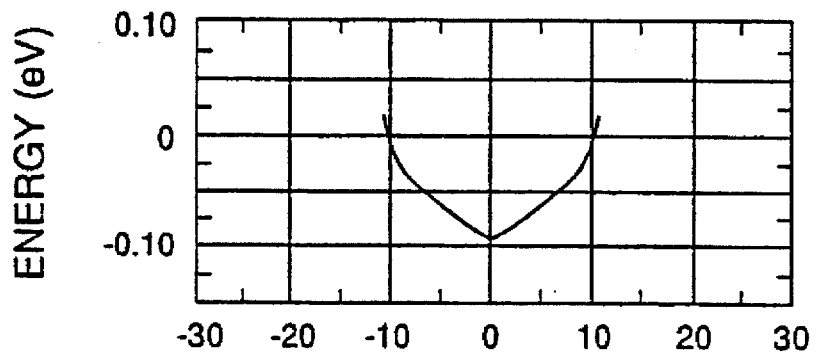
Figure 2:
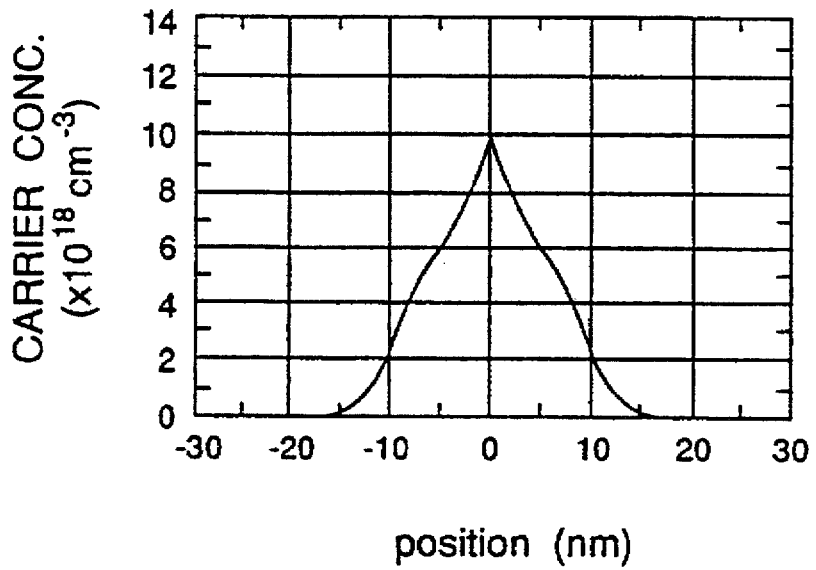

FIGS. 2(a), 2(b), and 2(c) respectively show a structure, a spatial distribution of potential energy, and a spatial distribution of electron concentration of the HEMT structure when the spacer layer 3 has a concavo-convex periodic structure that has a cross-section having reverse triangular configurations and that has a (111)B surface. This simulation result is obtained by solving the Schroedinger equation without contradiction. It is found that almost all electrons are confined in regions having a width of 20 nm, as shown in FIG. 2(c).

The quantum wire superlattice structure is constructed by forming the semiconductor epitaxially grown layers 2, 3, 4, and 5 to have a heterostructure including the spacer layer 3 with the concavo-convex periodic structure 30 and disposing Schottky electrodes 6 periodically on the semiconductor epitaxial growth layers 2, 3, 4, and 5 in a direction perpendicular to the cross-section of the periodic structure 30, as shown in FIG. 1.

In the structure of FIG. 1, when an appropriate bias voltage is applied to the Schottky electrodes 6, the electron storage regions 7 directly opposite each of the Schottky electrodes 6 are depleted. Accordingly, by applying a bias voltage to the Schottky electrodes 6, it is possible to change the electron storage state of the electron storage regions 7 from a quantum wire to a quantum box. In a region intermediate a quantum wire and a quantum box, tunneling of an electron to an adjacent quantum box is slightly possible. More particularly, an electron is not perfectly confined in a quantum box but a plurality of quantum boxes that are weakly connected is realized. Under such a bias voltage, the structure serves as a quantum wire superlattice structure. In this way, it is possible to modulate the electron state from a quantum wire to a quantum wire superlattice or further to a quantum box by changing the bias voltage level.

In the structure of the first embodiment, the active region 7, an electron storage region, comprises the undoped GaAs layer 2 and, therefore, it is possible to suppress scattering of electrons by impurity atoms as well as to suppress scattering of electrons by optical phonons that are dependent on the effect of the quantum wire superlattice described above. Thus, a high mobility semiconductor device, i.e., a quantum wire superlattice that has not been previously realized, can be realized even at room temperature.

In the quantum wire superlattice of the first embodiment, the semiconductor epitaxial layers 2, 3, 4, and 5 forming a hetero structure including the concavo-convex periodic structure 30 in the spacer layer 3 are provided and a plurality of Schottky electrodes 6 are periodically disposed on the semiconductor layer structure, arranged in a direction perpendicular to the concavo-convex periodic structure 30. Therefore, by utilizing regions of the electron storage region 7 directly opposite the Schottky electrodes 6 that are depleted when an appropriate bias voltage is applied to the Schottky electrodes 6, it is possible to modulate the electron storage state of the region 7 from a quantum wire to a quantum wire superlattice or further to a quantum box upon application of a bias voltage to the electrode 6, thereby producing a quantum wire superlattice.

Embodiment 2

Figure 19:
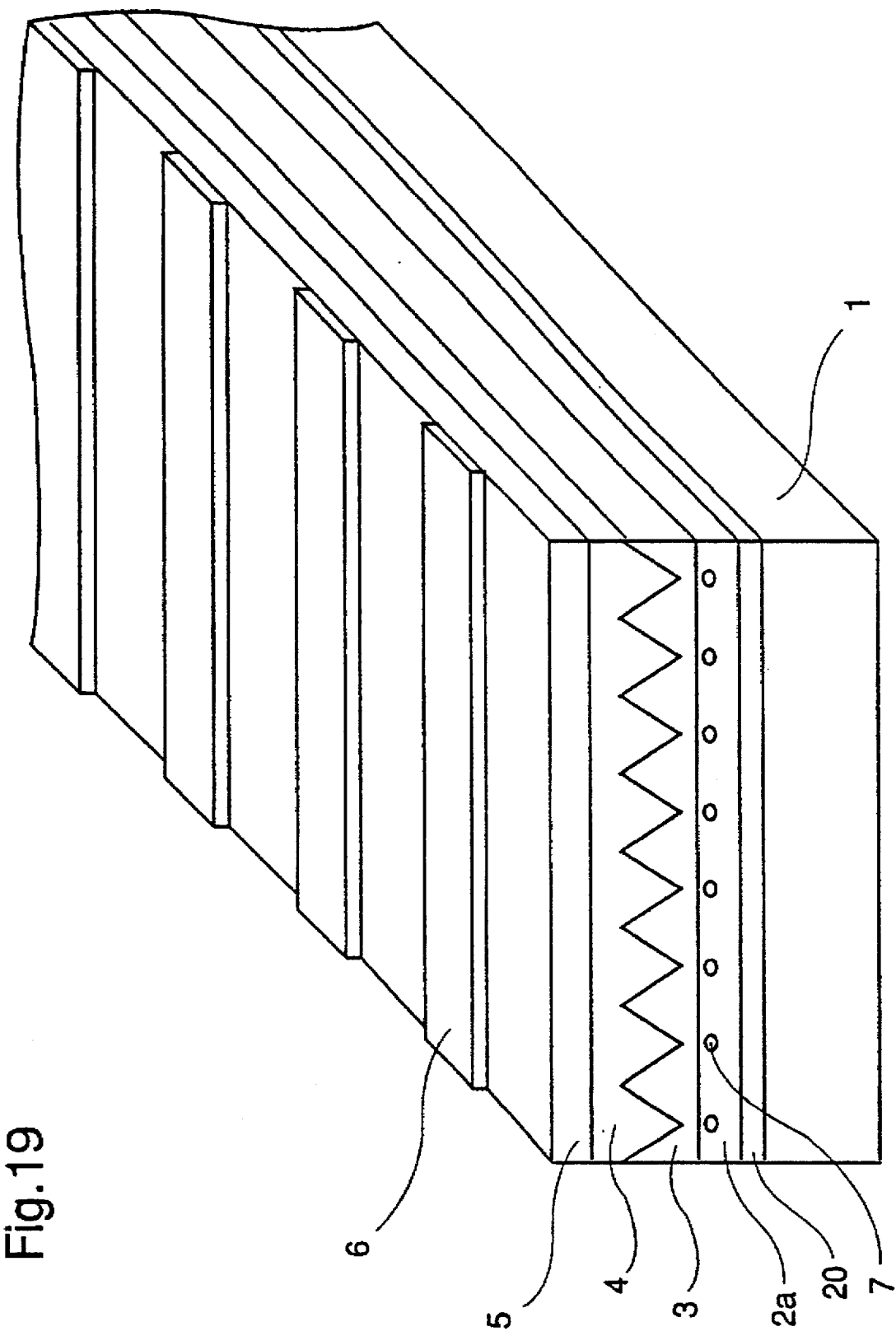
FIG. 19 is a perspective view illustrating a semiconductor device having a quantum wire superlattice according to a second embodiment of the present invention.

Referring to FIG. 19 showing the second embodiment of the present invention, an undoped $In_{0.15}Ga_{0.85}As$ layer 2a comprising GaAs as a first semiconductor, to which In is added, is used in place of the undoped first semiconductor GaAs layer 2 in the first embodiment, an undoped $Al_{0.3}Ga_{0.7}As$ spacer layer 3 that has a smaller electron affinity than InGaAs is disposed on the undoped InGaAs layer 2a, and an undoped GaAs layer 20 as a buffer layer is inserted between the semi-insulating GaAs substrate 1 and the undoped InGaAs layer 2a.

In the semiconductor device of the second embodiment, similar effects as in the first embodiment are obtained. In addition, because the channel layer forming the electron storage region 7 comprises an InGaAs layer, a device of higher mobility, relative to the first embodiment, is realized.

Embodiment 3

Figure 20:
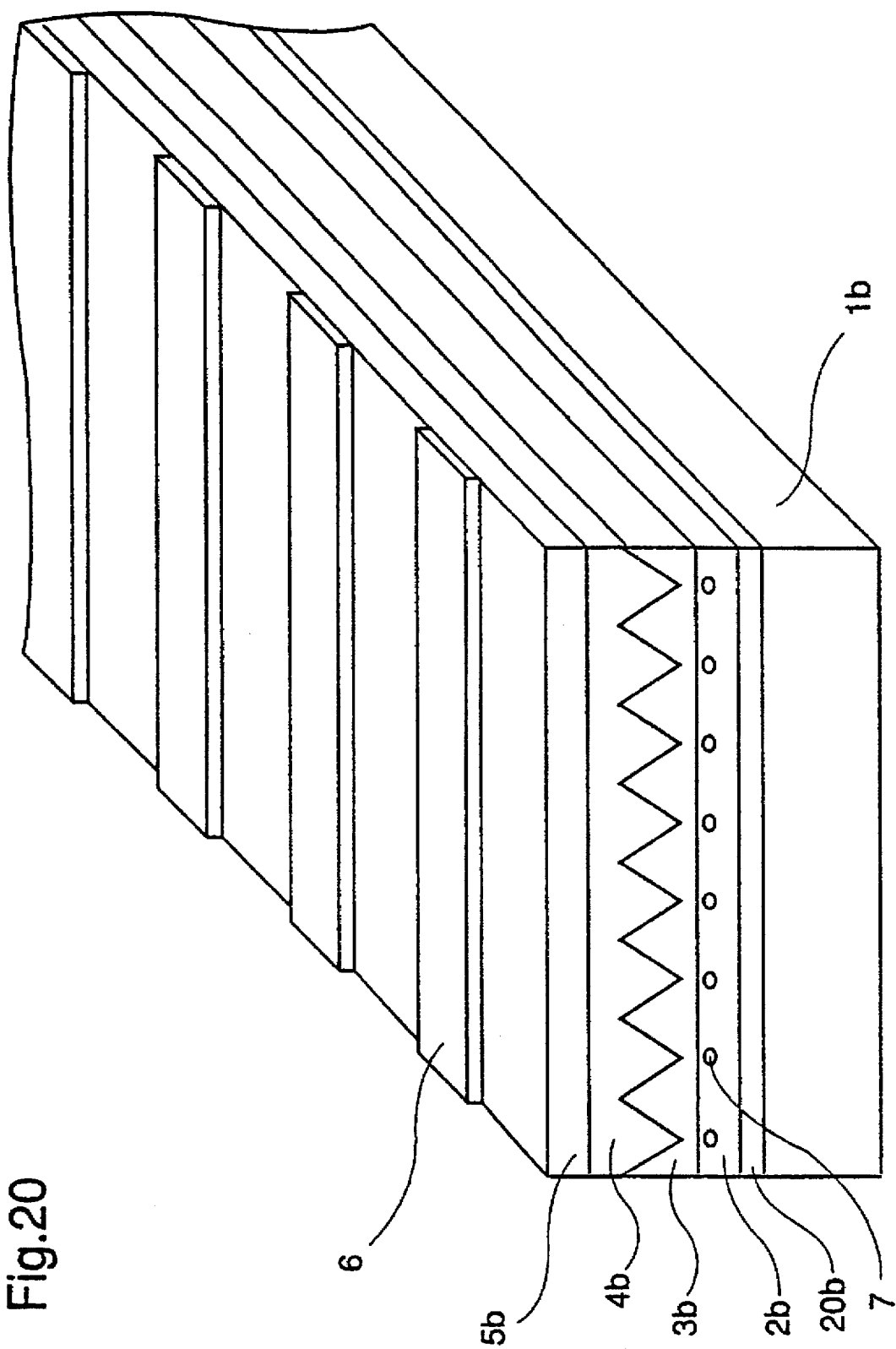
FIG. 20 is a perspective view illustrating a semiconductor device having a quantum wire superlattice according to a third embodiment of the present invention.

Referring to FIG. 20 showing the third embodiment of the present invention, the semi-insulating GaAs substrate 1 in the second embodiment is replaced by a semi-insulating InP substrate 1b, the undoped InGaAs layer 2a is replaced by an undoped $In_{0.53}Ga_{0.47}As$ layer 2b, the undoped GaAs layer 20 as a buffer layer is replaced by an undoped $Al_{0.48}In_{0.52}As$ buffer layer 20b, the undoped AlGaAs spacer layer 3 is replaced by the undoped $Al_{0.48}In_{0.52}As$ spacer layer 3a, the n type AlGaAs electron supply layer 4 is replaced by an n type $Al_{0.48}In_{0.52}As$ electron supply layer 4b, and the n type GaAs contact layer 5 is replaced by an n type InGaAs contact layer 5b, respectively. The other elements, i.e., the Schottky electrodes 6 and the electron storage regions 7 are the same as in the first embodiment.

In the semiconductor device of this third embodiment, similar effects as in the first embodiment are obtained. In addition, because the channel layer forming the electron storage region 7 comprises the undoped InGaAs layer 2b, a device of a high mobility relative to the first embodiment is realized.

Embodiment 4

Figure 21:
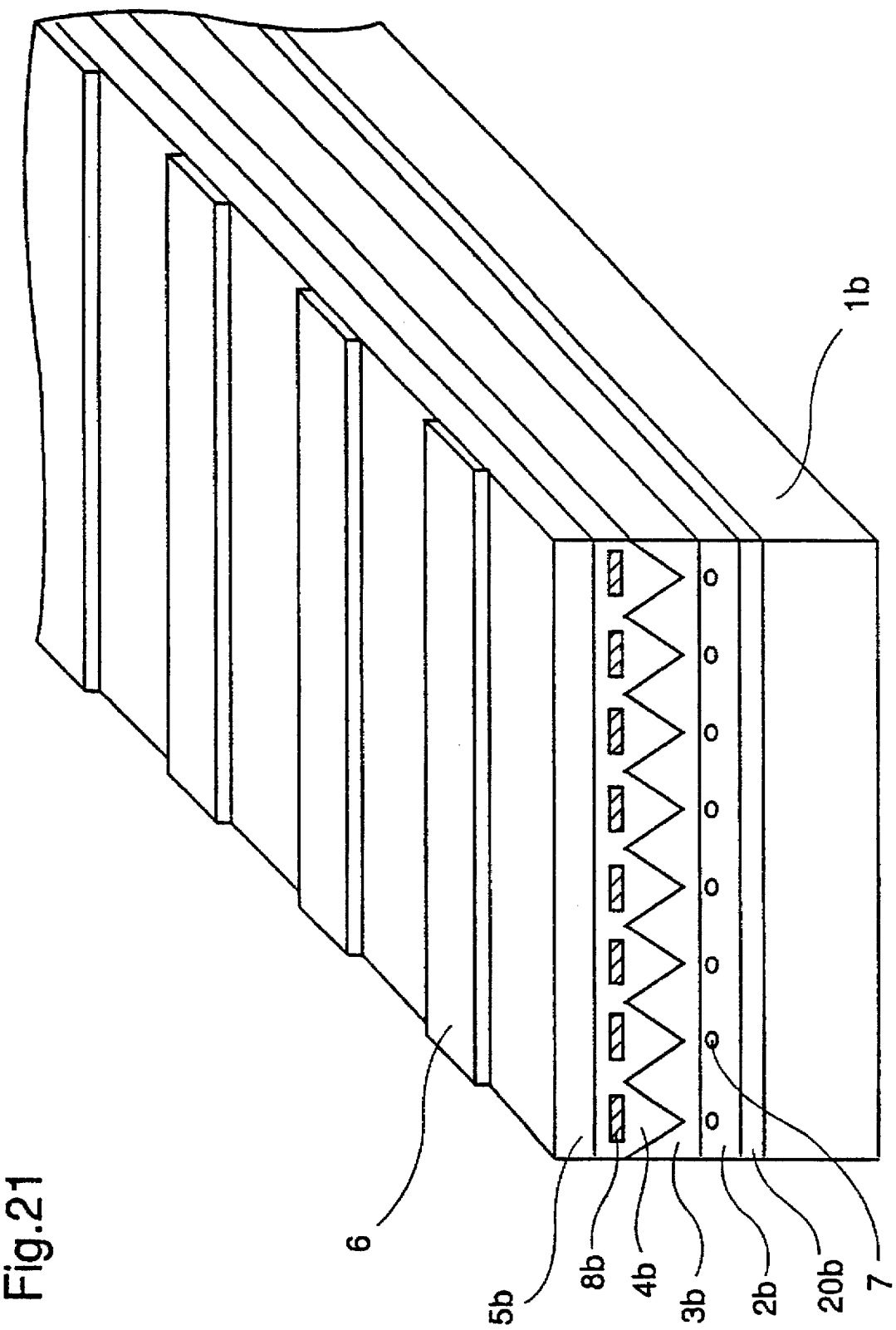
FIG. 21 is a perspective view illustrating a semiconductor device having a quantum wire superlattice according to a fourth embodiment of the present invention.
Figure 22:
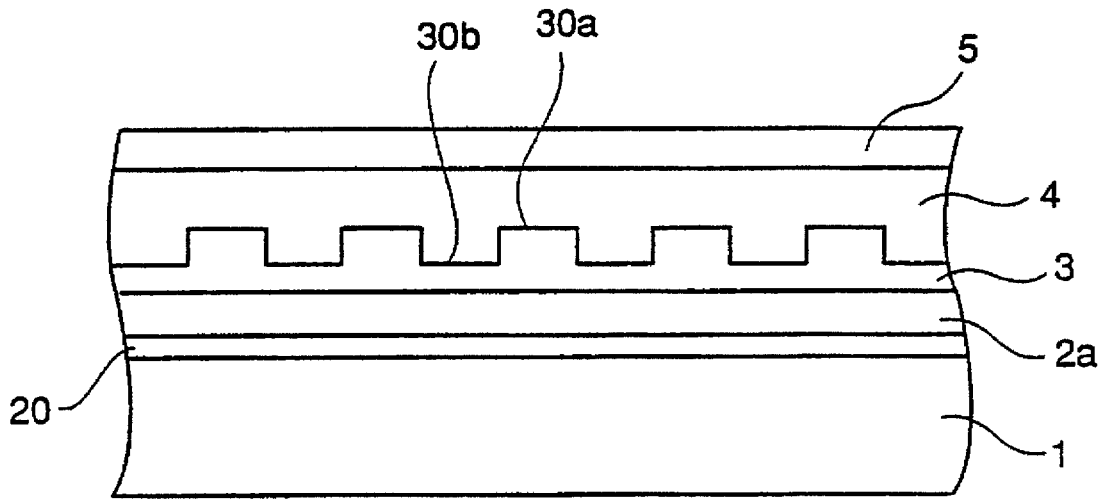
FIGS. 22(a) and 22(b) are a (0Ī1) cross-section and a (011) cross-section, respectively, for explaining a semiconductor device having a quantum wire superlattice structure according to a seventh embodiment of the present invention.
Figure 22:
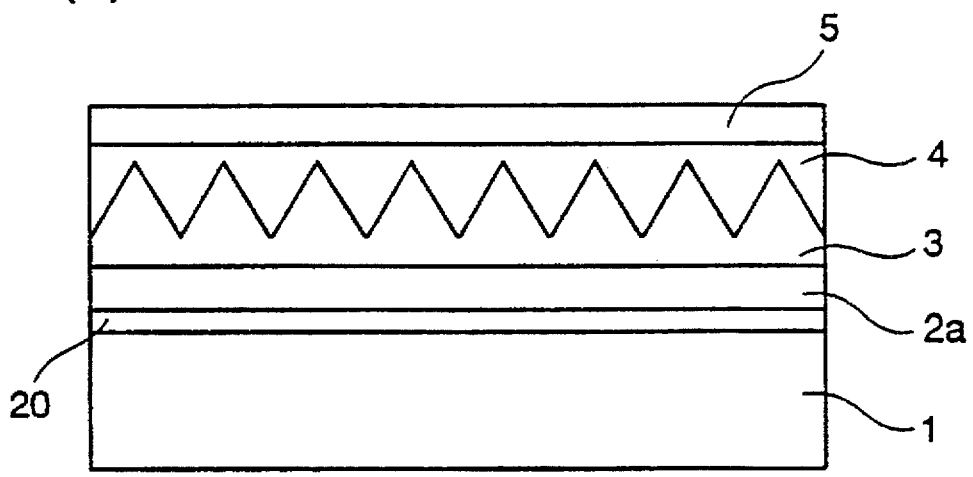

FIG. 21 shows a semiconductor device having a quantum wire superlattice according to the fourth embodiment of the present invention. This fourth embodiment has an undoped $Al_{0.48}In_{0.52}As$ cap layer 8b on the n type AlInAs electron supply layer 4b of the third embodiment.

In this semiconductor device of the fourth embodiment, similar effects as in the first embodiment are obtained. In addition, because the channel layer comprises an InGaAs layer, as in the second and third embodiments, a higher mobility device is realized.

Embodiment 5

A method of making a semiconductor device according to a fifth embodiment of the present invention relates to a method for fabricating a semiconductor device having a quantum wire superlattice structure according to the first embodiment.

Figure 3:
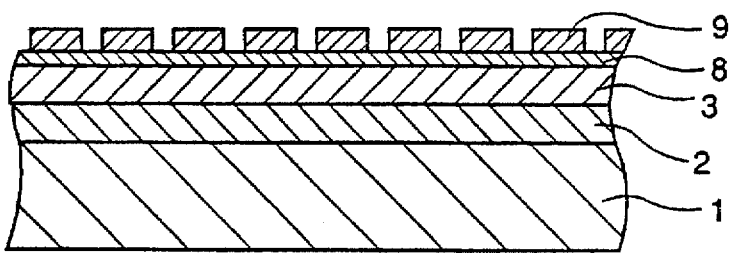
FIGS. 3(a)–3(f) are cross-sectional views illustrating a method of fabricating a quantum wire superlattice structure of the first embodiment in accordance with a fifth embodiment of the present invention.
Figure 3:
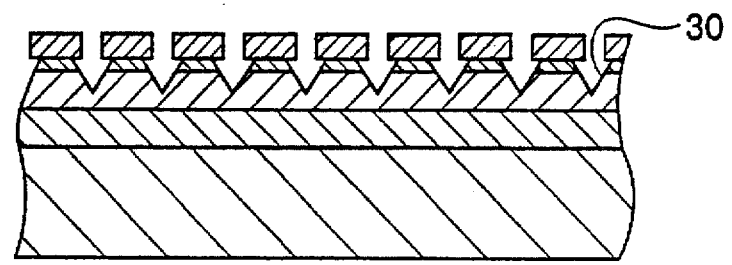
Figure 3:
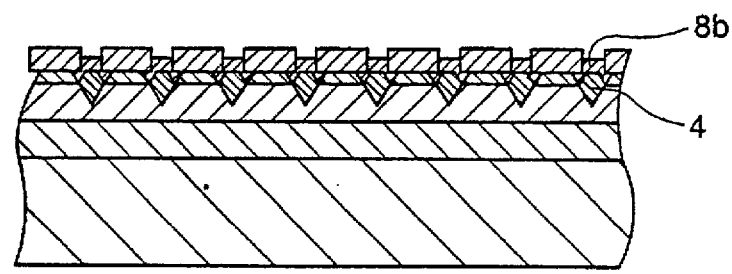
Figure 3:
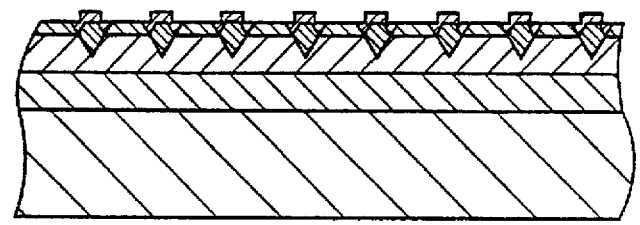
Figure 3:
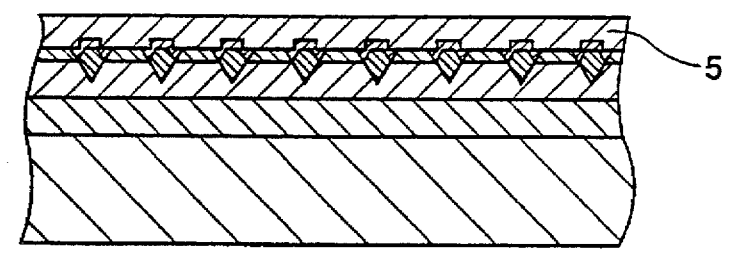
Figure 3:
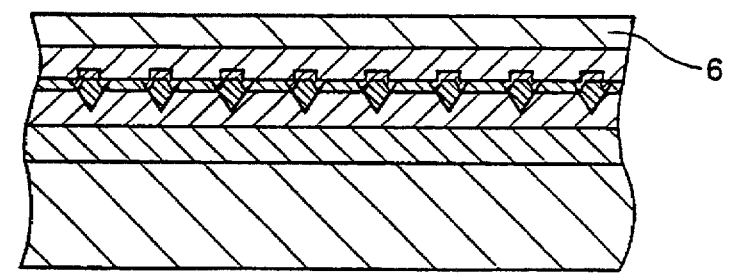

First of all, an undoped GaAs buffer layer 2, an undoped AlGaAs spacer layer 3, and an n type GaAs cap formation layer 8 are successively formed on a semi-insulating GaAs substrate 1 by MOCVD (metal organic chemical vapor deposition) or MBE (molecular beam epitaxy). Further, an SiN film 9 is formed by plasma CVD, and it is patterned into a pattern of lines and spaces having a 25 nm period (FIG. 3(a)).

Employing the SiN film 9 patterned into a pattern of lines and spaces as a mask, HCl gas is used to etch the n type GaAs cap formation layer 8 and the undoped AlGaAs spacer layer 3, thereby forming V-shaped grooves 30 having (111)B surfaces. One of the sloped surfaces formed by this HCl gas etching is a (111)B surface that is crystallographically correct, and the etched surface is quite close to being a mirror surface.

By a method of such as MOCVD, the n type AlGaAs electron supply layer 4 is selectively grown and an n type GaAs cap layer 8b is selectively grown thereon to bury the V-shaped groove 30, and the SiN film 9 is removed (FIGS. 3(c), 3(d)).

After regrowing an n type GaAs contact layer 5 to cover the n type GaAs cap layer 8b and the n type AlGaAs electron supply layer 4, the Schottky electrode metal is formed on the entire surface by deposition and it is patterned, thereby forming Schottky electrodes 6 having a periodic stripe shape (FIGS. 3(e), 3(f)).

The processes after etching the n type GaAs cap formation layer 8 and the undoped AlGaAs spacer layer 3 and forming the V-shaped groove 30 having (111)B surfaces, forming the n type AlGaAs electron supply layer 4 and the n type GaAs cap layer 8b on the V-shaped groove 30, are described more particularly.

First of all, a GaAs substrate 1, after patterning the SiN film 9 as shown in FIG. 3(a), is placed in an MOCVD film, and the temperature is raised to 350° C. in a hydrogen gas and arsine (AsH$_3$) ambient. While keeping the wafer at a temperature of 350° C., HCl gas is introduced into the apparatus with hydrogen and arsine gas. Processing with these gases is carried out for 100 minutes, and thereby the natural oxide film (not shown) formed during patterning the SiN film 9 at the surface of the GaAs cap layer 8 is removed. The removal of the oxide film from the GaAs cap layer B is performed using a halogen compound gas, such as HCl, with repeated successive adsorption and desorption of the oxide film. This processing is performed under a hydrogen flow rate of 2.5 slm (liter/min.), an $AsH_3$ (20%) flow rate of 10 sccm (cc/min.), and an HCl (10%) flow rate of 40 sccm. Thereby the oxide film at the surface of the GaAs cap layer 8 is completely removed. Here, $AsH_3$ is added to control desorption of As from the upper surface of the GaAs cap layer 8 during the low temperature processing. Besides, as the gas including a halogen, chlorine, such as $Cl_2$, a gas including bromine, such as HBr or $CH_3Br$, and a gas including iodine, such as $CH_3I$, may be employed. In addition, the processing temperature may be below 450° C.

Next, as shown in FIG. 3(b), the temperature of the GaAs substrate 1 is raised to 750° C., and etching is performed employing a conventional HCl gas etching step with flow rates of hydrogen, $AsH_3$, and HCl similar to those used in cleaning at a low temperature of 350° C. as described above. Thereby, the V-shaped grooves 30 having (111)B surfaces are formed as described above. On the V-shaped grooves 30 formed by this etching, an n type AlGaAs electron supply layer 4 and an n type GaAs cap layer 8b are selectively regrown successively without being exposed to air, i.e., by growth in the same chamber used for etching or by employing a system including two chambers connected with each other by a load lock (FIG. 3(c)).

In the method described above, it is possible to, after perfectly removing the natural oxide film at the surface of the GaAs cap layer 8 at a temperature below 450° C., carry out the conventional HCl gas etching and further crystal regrowth, thereby obtaining material of good crystalline quality grown on the surface of the V-shaped groove without depositing an oxide film at the regrowth interface and to regrow the n type AlGaAs electron supply layer 4 and the n type GaAs cap layer 8b with superior crystalline quality.

In the fifth embodiment of the present invention, by fabricating the quantum wire superlattice structure in the semiconductor device according to the first embodiment employing the described fabrication process, the structure shown in the first embodiment can be fabricated with high controllability without directly processing the active region that functions as a channel region, i.e., the undoped GaAs layer 2. Accordingly, by employing the method of the fifth embodiment, a good quality quantum wire superlattice structure is realized for the first time.

The fabricating method according to the fifth embodiment can be also applied to fabrication of semiconductor devices according to the second to fourth embodiments. While in the fifth embodiment arsine ($AsH_3$) is supplied to control desorption of As from the processing surface during low temperature processing or the like, when applied to semiconductor devices according to the second to fourth embodiments, it is possible to carry out good cleaning or etching by supplying a Group V gas depending on the object to which the low temperature processing is applied. Particularly, in the second embodiment, arsine gas may be supplied to adjust the desorption of As from the processing surface as in the first embodiment and in the third and fourth embodiments phosphine ($PH_3$) may be supplied to adjust the desorption of P from the processing surface, and in either case the same effects as in the fifth embodiment are obtained.

Embodiment 6

Figure 4:
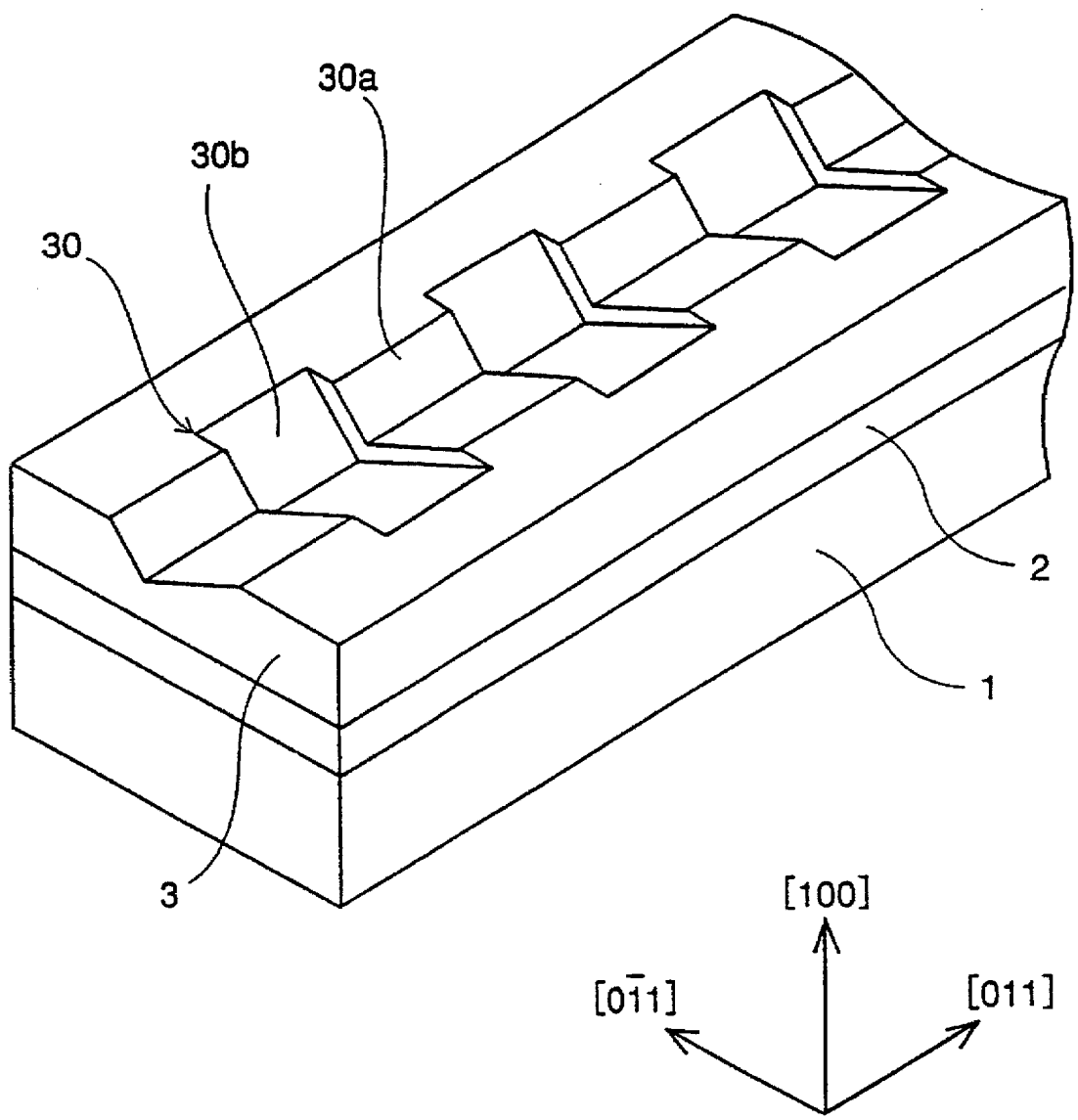
FIG. 4 is a perspective view illustrating a quantum wire superlattice structure according to a sixth embodiment of the present invention.
Figure 5:
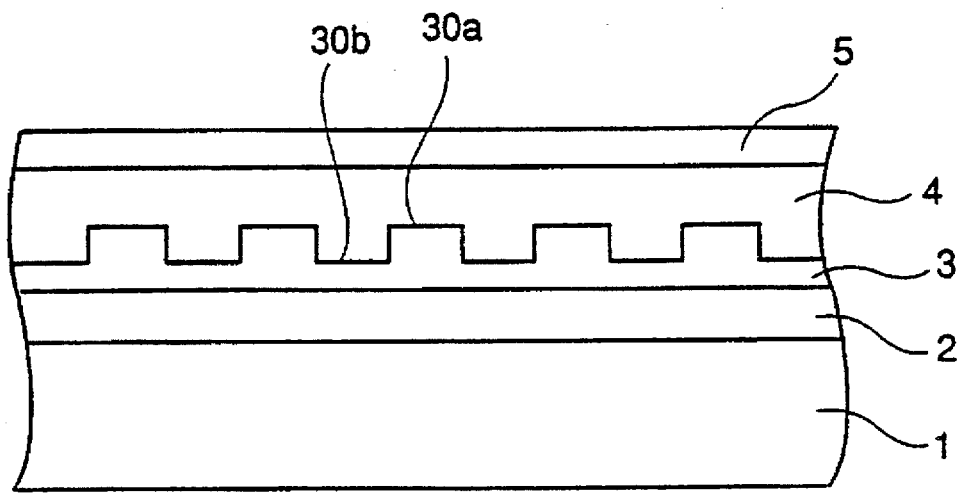
FIGS. 5(a) and 5(b) are ($0\bar{1}1$) and (011) cross-sections of a quantum wire superlattice structure of the sixth embodiment, respectively.
Figure 5:
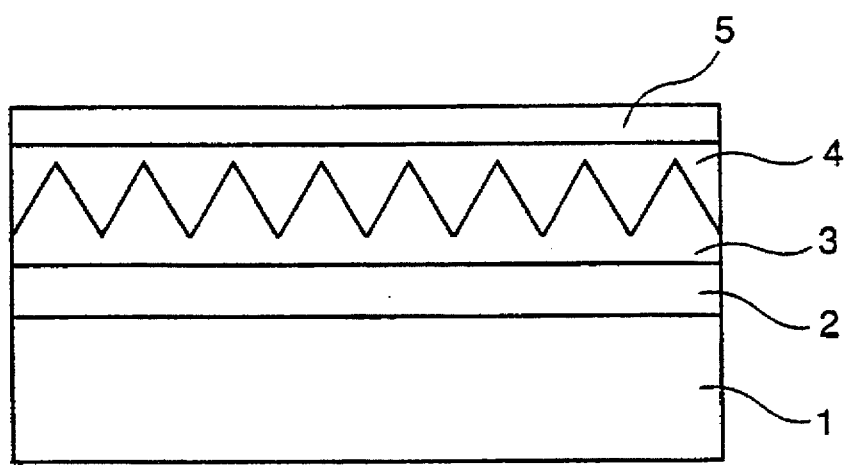

FIG. 4 is a perspective view for explaining a semiconductor device having a quantum wire superlattice structure according to a sixth embodiment of the present invention. FIG. 5(a) is a (($0\bar{1}1$) cross-section and FIG. 5(b) is a (011) cross-section of the semiconductor device of FIG. 4.

In FIGS. 4, 5(a), and 5(b), reference numerals 1, 2, 3, 4, and 5 designate the same elements as in the first embodiment, where 1 designates a semi-insulating GaAs substrate, 2 designates an undoped GaAs buffer layer, 3 designates an undoped $Al_{0.3}Ga_{0.7}As$ spacer layer, 4 designates an n type $Al_{0.3}Ga_{0.7}As$ electron supply layer, and 5 designates an n type GaAs contact layer. In the sixth embodiment, the V-shaped groove 30 at the spacer layer 3 has a structure in which the depth of the groove varies periodically along the length direction, i.e., a structure having a shallow portion 30a (having a depth of about 5 nm) and a deep portion 30b (having a depth of about 30 nm), as shown in FIG. 5(a). In FIG. 4, for simplification of illustration, only one groove is depicted in the $0\bar{1}1$ direction for the groove 30, because the groove 30 is periodic, as illustrated in FIG. 5(b). On the top surface of V groove 30 having a deep portion 30a and a shallow portion 30b, an n type AlGaAs electron supply layer 4 and an n type GaAs layer 5 are grown by MOCVD or the like, whereby a fundamental structure of a quantum wire superlattice in which the thickness of a spacer layer 3 varies periodically along the [011] direction is fabricated.

Figure 6:
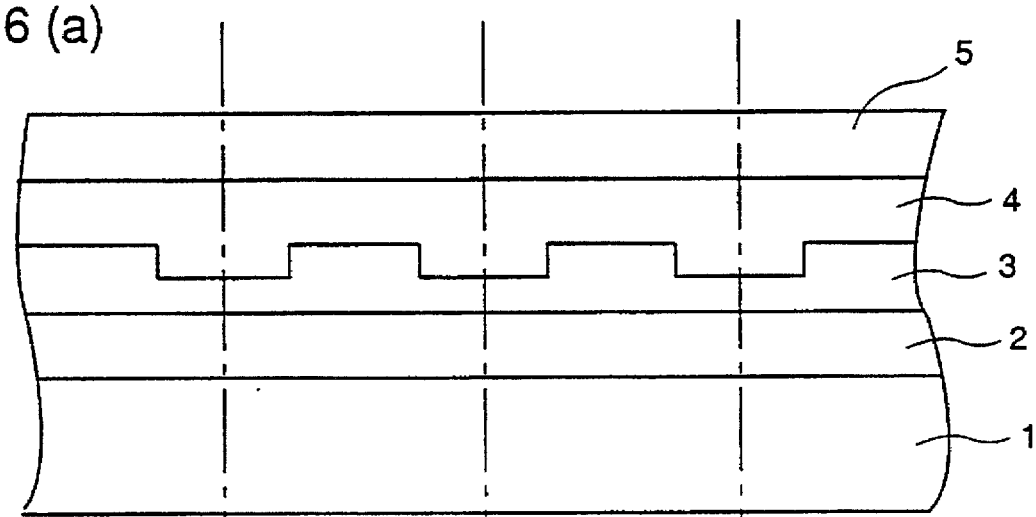
FIGS. 6(a) and 6(b) are an (0Ī1) cross-section and a concentration distribution in the [011] direction of electrons stored at the interface between an undoped GaAs layer and an undoped AlGaAs spacer layer, respectively, in a quantum wire superlattice structure of the sixth embodiment.
Figure 6:
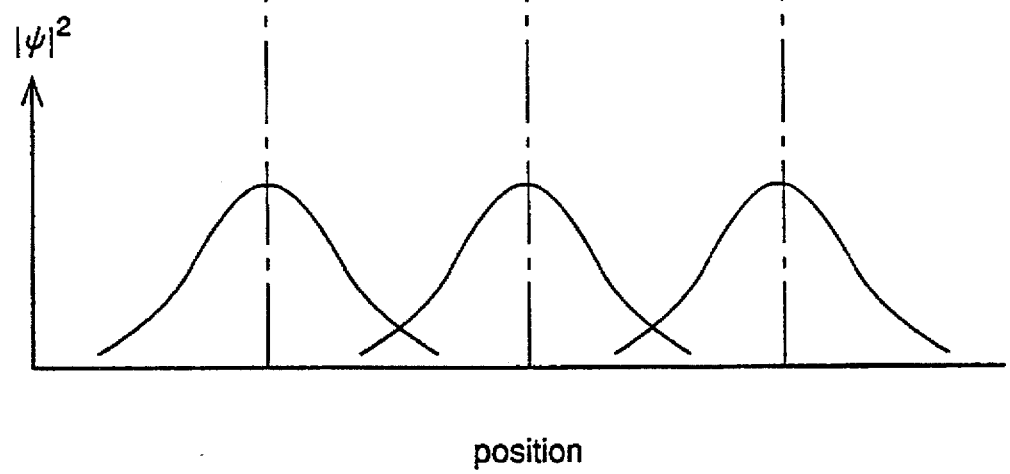

FIG. 6(a) is a ($0\bar{1}1$) cross-section and FIG. 6(b) is a diagram illustrating the electron concentration in the [011] direction, i.e., electrons which are stored at the interface between the undoped GaAs layer 2 and the undoped AlGaAs spacer layer 3. As shown in FIGS. 6(a) and 6(b), electrons are stored in a high concentration in the region 3a of the thin spacer layer 3 while few electrons are stored at the region 3b of the thick spacer layer 3, whereby an electron concentration distribution as shown in FIG. 6(b) is realized. The quantity of stored electrons can be controlled according to the thickness of the spacer layer, the thickness of the electron supply layer, and the bias voltage, all according to the physical principle that is disclosed in Japanese Published Patent Application No. Hei 4-199519. In addition, since the confinement of electrons in the [($0\bar{1}1$) direction is realized with a 20 nm width, as shown in FIG. 2(c), as in the first embodiment, it is possible to produce a quantum wire superlattice having a width of 20 nm in a high density by employing the structure of this sixth embodiment.

In the sixth embodiment of the present invention, because it is possible to fabricate a semiconductor device having a quantum wire superlattice according to the first embodiment in which the active region, i.e., the electron storage region 7, is formed in the undoped GaAs layer 2, suppression of impurity scattering and of optical phonon scattering can be achieved at the same time, whereby a semiconductor device having a high electron mobility that has not previously been realized can be realized, even at room temperature.

Embodiment 7

A seventh embodiment of the present invention is realized by employing in the structure of the sixth embodiment an undoped $In_{0.15}Ga_{0.85}As$ layer 2a comprising GaAs to which In is added, in place of the undoped first semiconductor GaAs layer 2, disposing an undoped $Al_{0.3}Ga_{0.7}As$ spacer layer 3 having a smaller electron affinity than InGaAs, on the undoped InGaAs layer 2a, and further inserting an undoped GaAs layer 20 as a buffer layer between the semi-insulating GaAs substrate 1 and the undoped InGaAs layer 2a.

Also in the semiconductor device of this seventh embodiment, the same effects as in the sixth embodiment are obtained. In addition, since the channel layer forming the electron storage region 7 comprises a InGaAs layer, a device having a still higher electron mobility than the sixth embodiment is realized.

Embodiment 8

Figure 23:
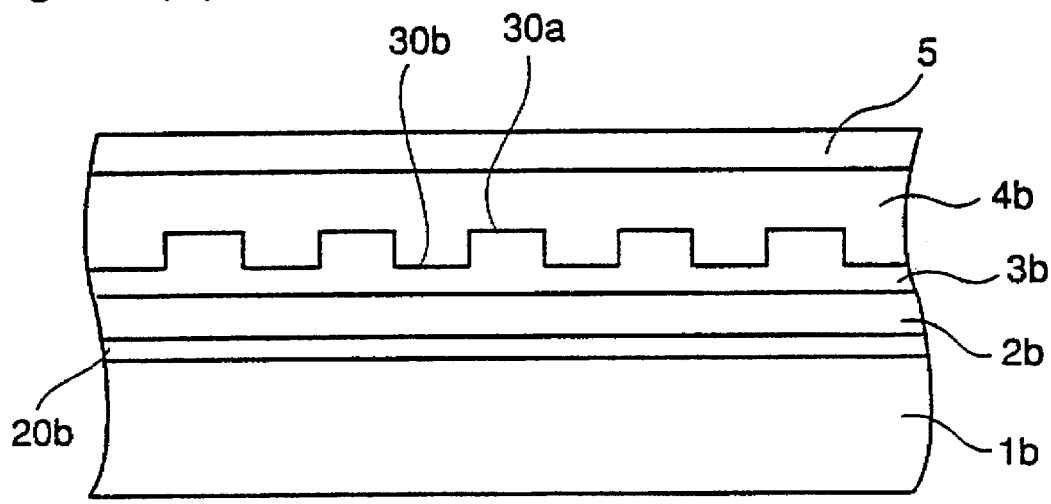
FIGS. 23(a) and 23(b) are a (0Ī1) cross-section and a (011) cross-section, respectively, of a semiconductor device having a quantum wire superlattice according to an eighth embodiment of the present invention.
Figure 23:
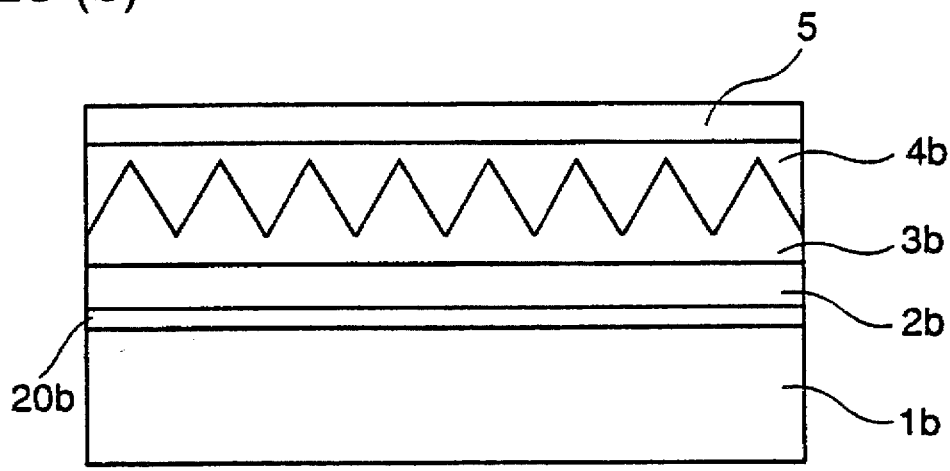

FIG. 23 is a diagram illustrating a semiconductor device having a quantum wire superlattice according to an eighth embodiment of the present invention. The eighth embodiment is realized by replacing the semi-insulating GaAs substrate 1 in the sixth embodiment with a semi-insulating InP substrate 1b, the undoped InGaAs layer 2a with an undoped $In_{0.53}Ga_{0.47}As$ layer 2b, the undoped GaAs layer 20 as a buffer layer with the undoped $Al_{0.48}In_{0.52}As$ buffer layer 20b, the undoped AlGaAs spacer layer 3 with an undoped n type $Al_{0.48}In_{0.52}As$ spacer layer 3b, the n type AlGaAs electron supply layer 4 with an n type $Al_{0.48}In_{0.52}As$ electron supply layer 4b, and the n type GaAs contact layer 5 with an n type InGaAs contact layer 5b. The Schottky electrode 6 and the electron storage region 7 are formed in the same way as in the sixth embodiment.

In the semiconductor device of the eighth embodiment, the same effects as in the sixth embodiment are obtained. In addition, since the channel layer forming the electron storage region 7 comprises an InGaAs layer, a device having a still higher electron mobility than the sixth embodiment is realized.

Embodiment 9

Figure 24:
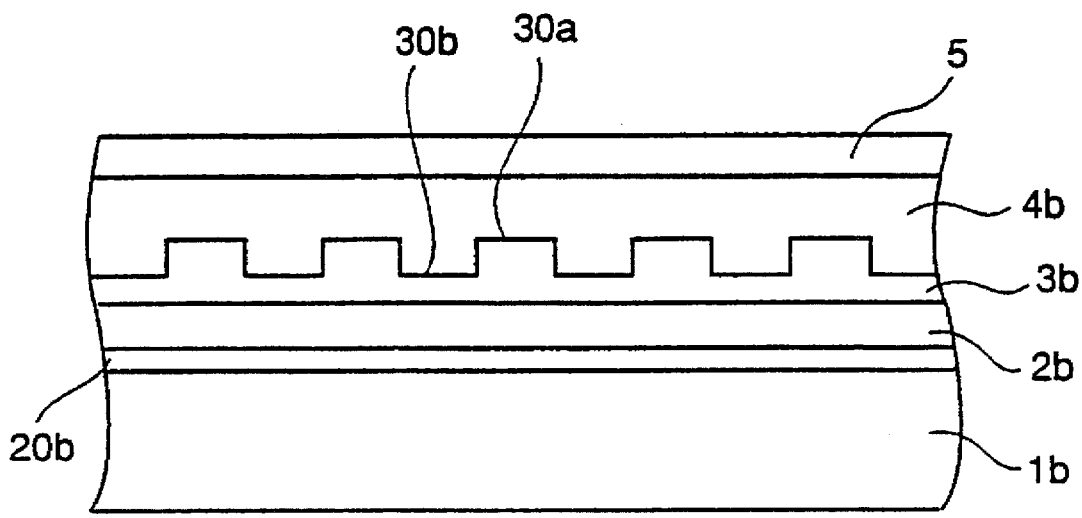
FIGS. 24(a) and 24(b) are a (0Ī1) cross-section and a (011) cross-section, respectively, of a semiconductor device having a quantum wire superlattice according to a ninth embodiment of the present invention.
Figure 24:
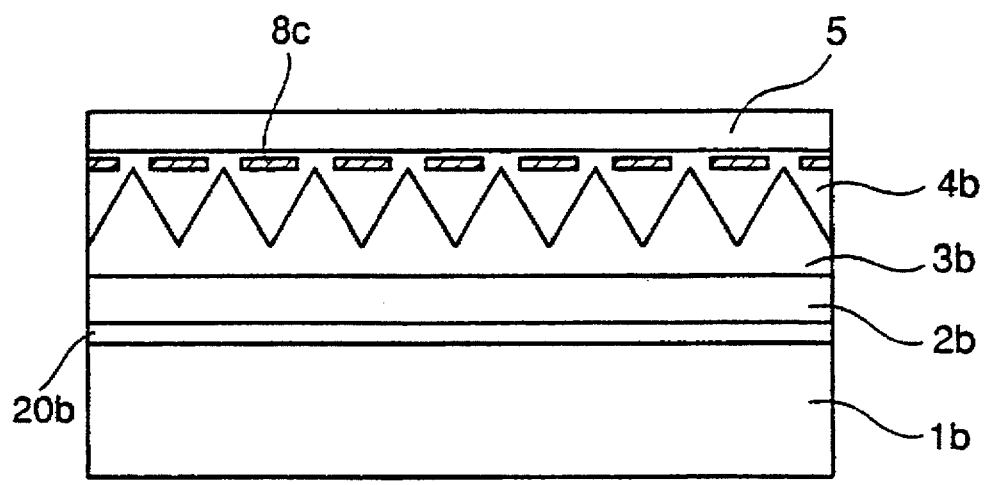

FIG. 24 is a diagram illustrating a semiconductor device having the quantum wire superlattice according to the ninth embodiment of the present invention. The ninth embodiment is realized by providing an undoped $Al_{0.15}In_{0.52}As$ cap layer 8c on the n type AlInAs electron supply layer 4b.

In the semiconductor device of the ninth embodiment, the same effects as in the sixth embodiment are obtained. In addition, as in the seventh and eighth embodiments, since the channel layer is an InGaAs layer, a device of a higher mobility is realized.

Embodiment 10

A description is given of a method for fabricating a semiconductor device having a quantum wire superlattice structure of the sixth embodiment. The fabricating method of the tenth embodiment will be described with reference to the FIGS. 3, 7, and 8. Similar to FIG. 3(a), an undoped GaAs layer 2, an undoped AlGaAs spacer layer 3, and an n type GaAs cap layer formation layer 8 are successively grown on a semi-insulating GaAs substrate 1 by MOCVD, MBE, or the like.

Figure 7:
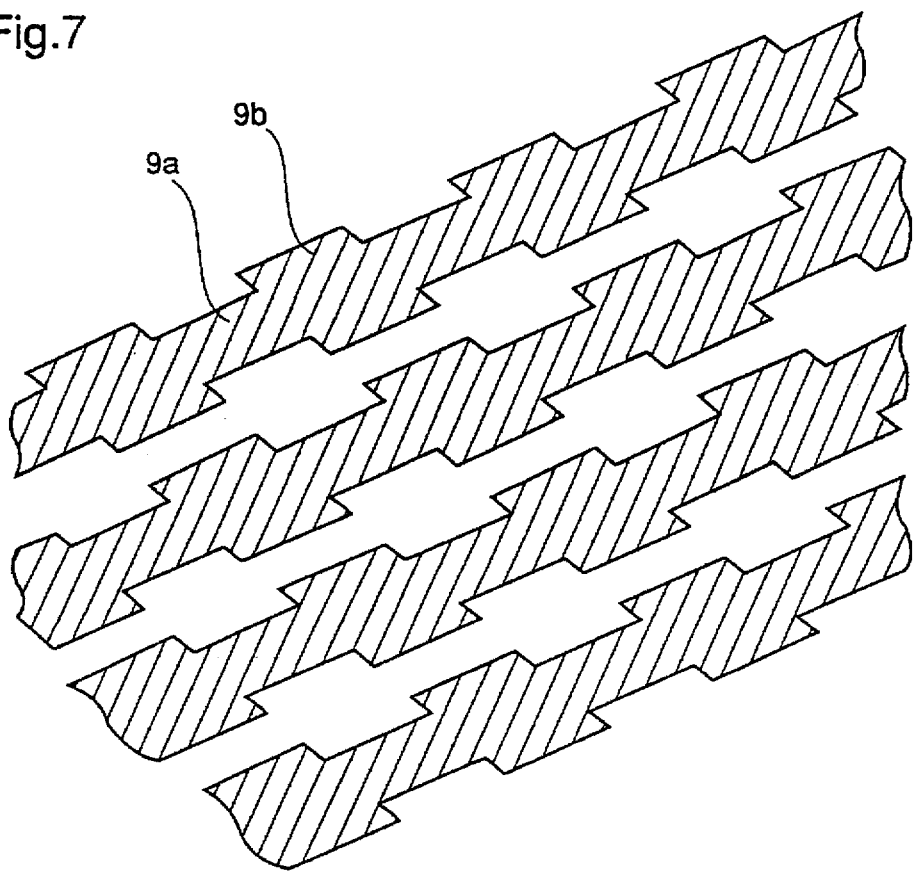
FIG. 7 is a perspective view illustrating a pattern of an insulating film mask employed in fabricating a quantum wire superlattice structure according to a tenth embodiment of the present invention.

Then, an SiN film 9 is formed thereon by plasma CVD or the like, and patterned to form a pattern comprising narrow portions 9a and wide portions 9b that are repeatedly and continuously formed as shown in FIG. 7. The patterning is performed by electron beam direct drawing or by X-ray exposure to form fine patterns.

Figure 8:
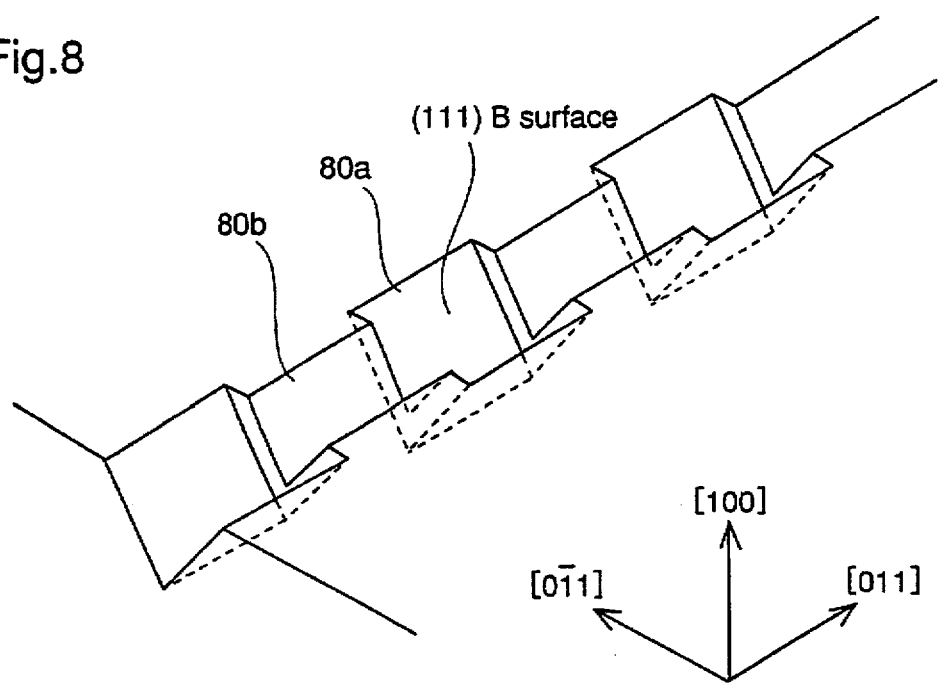
FIG. 8 is a diagram illustrating the etching configuration in fabricating a quantum wire superlattice structure according to a twelth embodiment of the present invention.

By employing HCl gas etching using the SiN film 9 as shown in FIG. 7 as a mask, a V-shaped groove 80 having (111)B surfaces is formed in the n type GaAs cap layer formation layer 8 and the undoped AlGaAs spacer layer 3 as a process (b). Because in this method the etching stops at the (111)B surface, a portion having a wide opening in the pattern of the mask 9 becomes a V-shaped groove 80a that is etched deeply, and the portion having a narrow aperture in the pattern of the mask 9 becomes a V-shaped groove 80b that is etched shallowly. Accordingly, by employing the pattern shown in FIG. 7, an etching configuration of a V-shaped groove 80 as shown in FIG. 8 can be easily obtained.

Then, the sloped surface formed by this method is a (111)B surface that is crystallographically correct, whereby a surface quite close to a mirror surface is obtained. As shown in FIGS. 3(b) and 3(c), an n type AlGaAs electron supply layer 4 and an n type GaAs cap layer 8c are selectively grown by MOCVD or the like to bury the V-shaped groove 80, as a process (c). The SiN film 9 is removed as shown in FIG. 3(d). As shown in FIG. 3(e), an n type GaAs layer 5 is regrown.

After etching the n type GaAs cap formation layer 8 and the undoped AlGaAs spacer layer 3, thereby forming a V-shaped groove 30 having (111)B surfaces, an n type AlGaAs electron supply layer 4 is formed in this V-shaped groove 30, and, further, an n type GaAs cap layer 8b is formed thereon, as in the fifth embodiment.

Here, the (b) and (c) processes are desirably performed continuously, without exposure to air, in the same chamber or employing a system including two chambers combined with a load lock.

In the tenth embodiment of the present invention, because the quantum well superlattice structure is formed by the processes described above, a structure according to the sixth embodiment can be easily obtained. In addition, since the structure of the sixth embodiment can be fabricated with good controllability without directly processing the active region, i.e., the channel region, a good quality quantum wire superlattice structure that has been conventionally difficult to realize can be realized for the first time.

Embodiment 11

In the fifth and tenth embodiments, HCl gas etching is employed to form the V-shaped groove 30 on the undoped AlGaAs spacer layer 3. However, the formation of the V-shaped groove may be carried out by employing other etching gases, for example, a chlorine-containing gas, such as $Cl_2$, a bromine-containing gas, such as HBr or $CH_3Br$, or an iodine-containing series gas, such as $CH_3I$, and the same etching configuration can be obtained.

Embodiment 12

Figure 9:
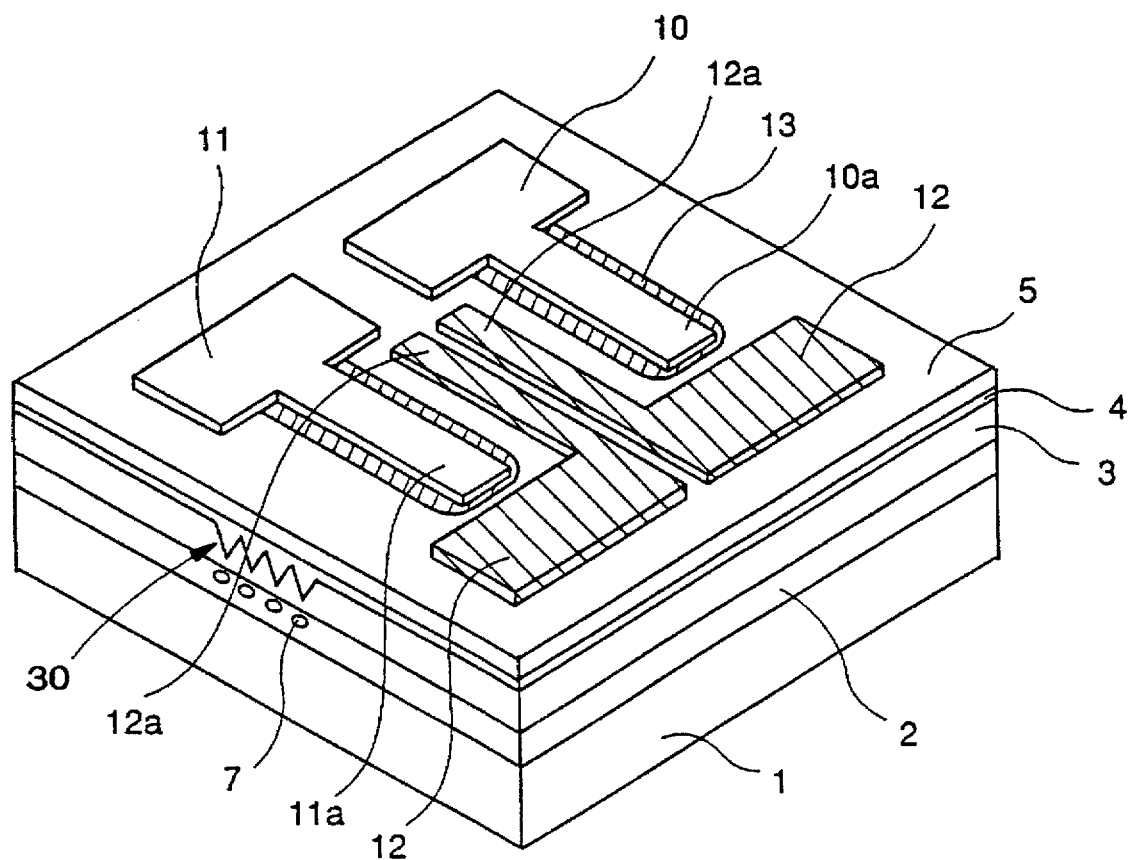
FIG. 9 is a perspective view illustrating a single electron device according to the tenth embodiment of the present invention.

FIG. 9 is a perspective view illustrating a single electron semiconductor device according to a twelfth embodiment of the present invention. In the figure, reference numeral 1 designates a semi-insulating GaAs substrate. An undoped GaAs layer 2 is disposed on the semi-insulating GaAs substrate 1. An undoped $Al_{0.3}Ga_{0.7}As$ spacer layer 3 is disposed on the undoped GaAs layer 2. A periodic concavo-convex structure 30 is disposed at a partial stripe-shaped region of the undoped AlGaAs spacer layer 3. An n type $Al_{0.3}Ga_{0.7}As$ electron supply layer 4 is disposed on the undoped AlGaAs spacer layer 3 burying the periodic concavo-convex structure 30 and to form a flat upper surface. An n type GaAs contact layer 5 is disposed on the n type AlGaAs electron supply layer 4. An electron storage region 7 is formed in the undoped GaAs layer 2. A source electrode 10 is disposed on the n type GaAs contact layer 5. Reference numeral 11 designates a drain electrode and reference numeral 12 designates a gate electrode. Reference numeral 13 designates an ion implanted region located partially below the source electrode 10 and the drain electrode 11, respectively.

As shown in FIG. 9, the twelfth embodiment of the present invention is realized by a structure comprising an undoped GaAs layer 2, an undoped $Al_{0.3}Ga_{0.7}As$ spacer layer 3, an n type $Al_{0.3}Ga_{0.7}As$ electron supply layer 4, and an n type GaAs layer 5 successively laminated on a semi-insulating GaAs substrate 1, a portion of the undoped AlGaAs spacer layer 3 is etched in a configuration having four reverse triangular configurations, the n type AlGaAs electron supply layer 4 buries the reverse triangular configuration etched region, a plurality of gate electrodes 12 are disposed so that the fingers 12a are close to each other on the upper surface of the semiconductor layer structure, and the source electrode 10 and the drain electrode 11 are arranged such that the fingers 10a and 11a confront each other with the fingers 12a of the gate electrode at regions confronting each other between the two gate electrodes 12, i.e., their fingers 12a. Here, the gate electrode comprises Ti/Pt/Au, forming a Schottky junction with the n type GaAs layer 5, and the source electrode 10 and the drain electrode 11 comprise AuGe/Ni/Au, forming ohmic contacts with the n type GaAs layer 5. The ion implanted regions 13 are regions below the source electrode 10 and the drain electrode 11, respectively, forming ohmic junctions with the n type GaAs layer 5.

In this structure, by applying an appropriate voltage to the gate electrode 12, electron storage regions 7 directly below the gate electrode 12 are depleted as in the first embodiment. Accordingly, the region between the two gate electrodes becomes a quantum dot, thereby isolating an electron in this region. As described in the prior art technique, by setting a gate voltage to a value that makes an electron hardly tunnel directly below the gate while applying a high frequency voltage to the two gate electrodes and shifting their phases by π, electrons can be transported sequentially, one-by-one, between the source and the drain. The current I in this case is represented by I=Mn$_{ef}$. Here, M represents the number of conduction channels, 4 in this embodiment. In the prior art single electron device, it is impossible to make the channel width sufficiently narrow and therefore operation is only possible at quite a low temperature, 10° K. In addition, because the channel width cannot be made sufficiently narrow, it is required to provide a side gate in order to make the device function as a single electron device and, therefore, it was impossible to provide a plurality of channels parallel to each other.

In the twelfth embodiment, it is easily possible to achieve a narrow channel width of about 20 nm and, also, because side gates are not required, it is possible to realize a multi-channel device easily. Here, the provision of multi-channels in the single electron device is a very important technique where a plurality of functions are to be provided in a device or a sufficient conductance is to be provided.

In the twelfth embodiment, the structure includes the undoped GaAs layer 2 as a buffer layer, the undoped AlGaAs spacer layer 3, the n type AlGaAs electron supply layer 4, and the n type GaAs layer 5, successively laminated on the semi-insulating GaAs substrate 1. A portion of the undoped AlGaAs spacer layer 3 has a configuration having four reverse triangular configurations and the n type AlGaAs electron supply layer 4 buries the etching region of the reverse triangular configuration. Two gate electrodes 12 are disposed on the upper surface of the semiconductor layer structure close to each other, the source electrode 10 and the drain electrode 11 are disposed confronting each other with the two gate electrodes 12 between them. An appropriate voltage is applied to the gate electrodes 12 to deplete the electron storage region 7 directly below the gate electrodes 12 and to form a quantum dot comprising the region that is between the two gate electrodes, thereby isolating an electron in this region. Electrons are carried sequentially, one-by-one, between the source and the drain by applying a high frequency voltage to the two gate electrodes with phases shifted by π. The prior art single electron device cannot be fabricated to have a channel width sufficiently narrow and cannot be operated except at quite a low temperature, 10° K. Further, since it is not possible to make the channel width sufficiently narrow, the prior art device cannot be operated as a single electron device without providing a side gate, provision of a plurality of parallel channels impossible. In this twelfth embodiment, however, it is easily possible to make the channel width narrow, i.e., about 20 nm, and since no side gate is required, it is also easily possible to provide a multi-channel device. The provision of a multi-channel single electron device is a very important technique that is required where a plurality of functions are provided and a sufficient conductance is obtained in a single device. This provision of a multi-channel single electron device can be easily achieved, whereby a logic element that is capable of performing at a higher speed due to its high mobility can be obtained.

Embodiment 13

Figure 10:
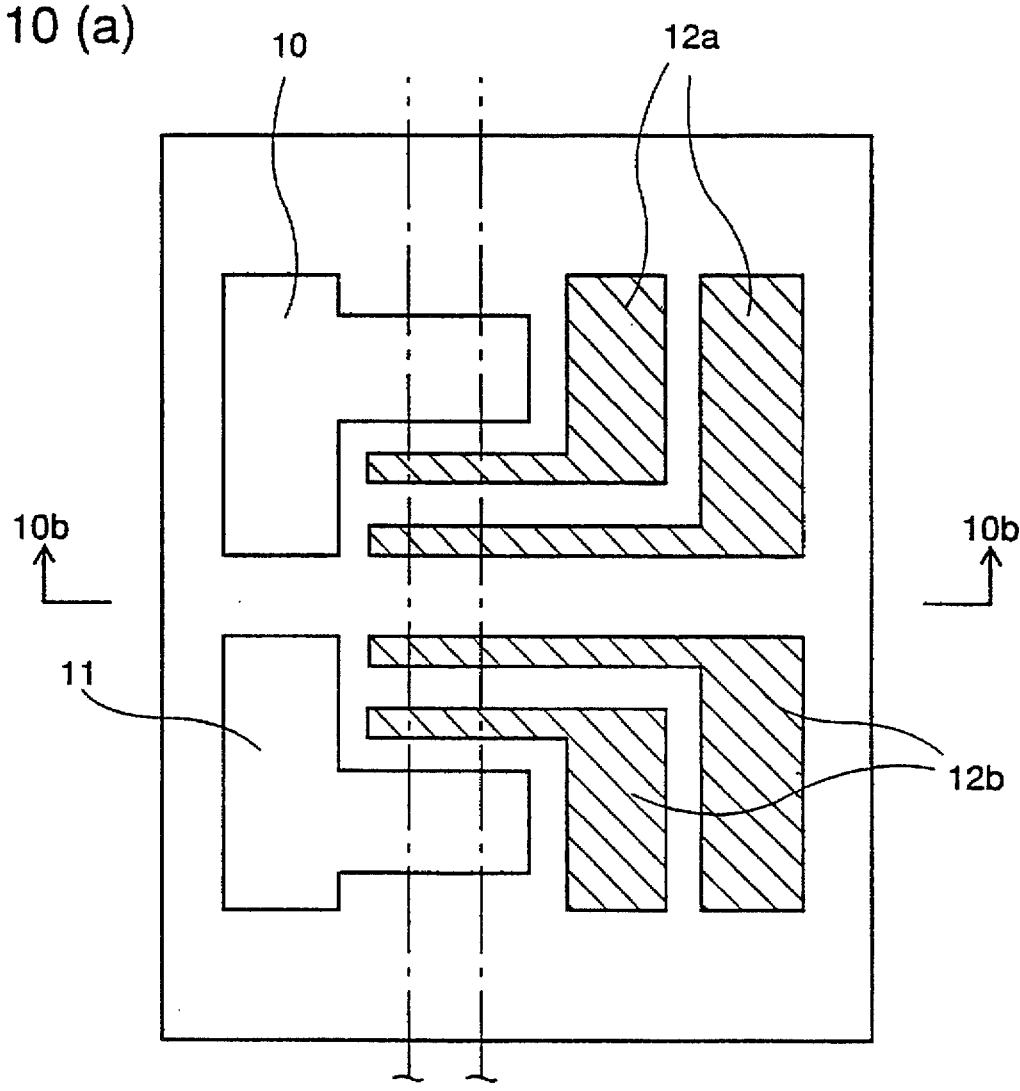
FIGS. 10(a) and 10(b) are a plan view and a cross-sectional view, respectively, of a single electron logic element according to a thirteenth embodiment of the present invention.
Figure 10:
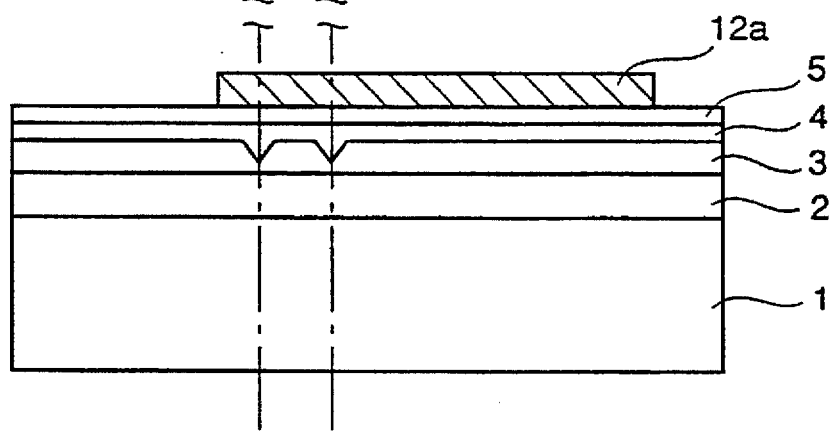

FIGS. 10(a) and 10(b) are a plan view and a cross-sectional view, respectively, of a single electron logic element according to a thirteenth embodiment of the present invention. The dotted lines in the figure represent positions of the electron storage regions 7a and 7b, respectively, of the thirteenth embodiment. The thirteenth embodiment has the same fundamental crystal structure as that of the tenth embodiment with the exception that two gate electrodes 12a and 12b are both located over respective channels between the source electrode 10 and the drain electrode 11.

As described for the twelfth embodiment, by applying an appropriate gate voltage to the gate electrodes 12a and 12b and applying a high frequency voltage to the both two gate electrodes 12a and 12b with phases shifted by 7, the current value between the source electrode 10 and the drain electrode 11 can be correct at a level of one electron. In this thirteenth embodiment, the first gate electrode 12a and the second gate electrode 12b are provided serially; in other words, the gate electrodes are located on the two electron storage regions 7a and 7b. Only when a high frequency voltage is applied to both gate electrodes 12a and 12b at the same time do the source and the drain enter the ON state. When the gate electrode 12a is taken as A and the second gate electrode 12b is taken as B, respectively, the truth table representing the relation between A and B and the output X between the source and the drain is as shown in FIG. 12(a), thereby showing that this element serves as an AND gate.

In the thirteenth embodiment, in the fundamental crystal structure that is the same as the twelfth embodiment, the two sets of gate electrodes 12a and 12b are disposed between the source electrode 10 and the drain electrode 11, serially. In other words, both gate electrodes are located on respective channels, whereby an AND circuit can be constituted by a single electron device, and a logic element capable of high speed operation due to its high mobility can be obtained.

Embodiment 14

Figure 11:
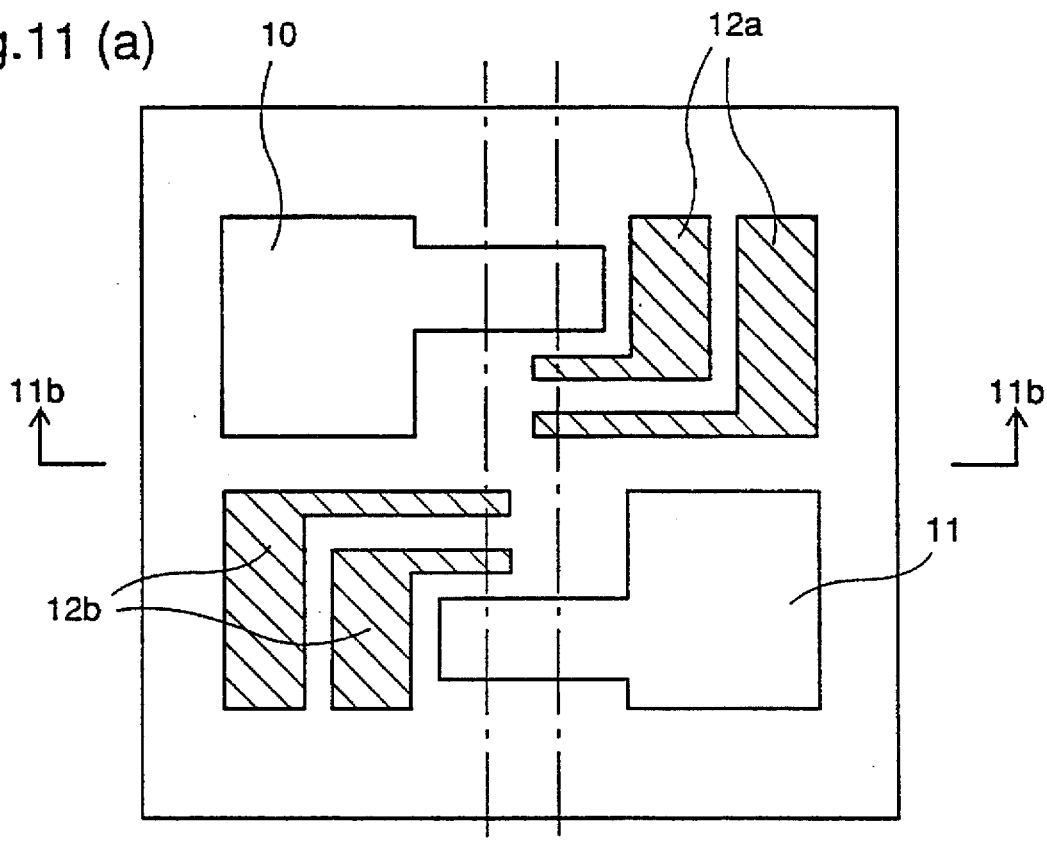
FIGS. 11(a) and 11(b) are a plan view and a cross-sectional view, respectively, of a single electron logic element according to a fourteenth embodiment of the present invention.
Figure 11:
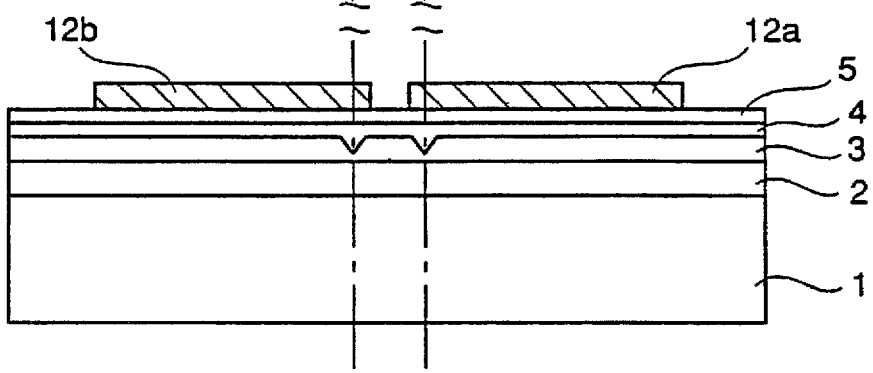

FIGS. 11(a) and 11(b) are a plan view and a cross-sectional structural view, respectively, of a single electron logic element according to a fourteenth embodiment of the present invention. The dotted lines in the figure represent the positions of the electron storage regions 7a and 7b, respectively. The fourteenth embodiment has the same fundamental crystal structure as that of the twelfth embodiment and gate electrodes 12a and 12b are, respectively, disposed on each of the electron storage regions 7a and 7b and between the source electrode 10 and the drain electrode 11 to enable turning on and off the current with the quantum dot of the channel.

In the fourteenth embodiment, the first gate electrode 12a and the second gate electrode 12b are arranged in parallel between the source electrode 10 and the drain electrode 11, and the respective gate electrodes are located on respective electron storage regions 7a and 7b. Accordingly, when a high frequency voltage is applied to at least one of the gate electrodes 12a and 12b, the path between source and drain is switched to the ON state. That is, when the first gate electrode 12a is taken as A and the second gate electrode 12b as B, respectively, the truth table representing a relation between both A and B and the output X between source and drain is as shown in FIG. 12(b). This truth table shows that this element operates as an OR gate.

In this fourteenth embodiment of the present invention, with a fundamental structure the same as that of the twelfth embodiment, two gate electrodes 12a and 12b are disposed in parallel between the source electrode 10 and the drain electrode 11, and thereby an OR circuit is constituted by a single electron device. Accordingly, a logic element capable of high speed operation due to its high mobility can be obtained.

Embodiment 15

Figure 13:
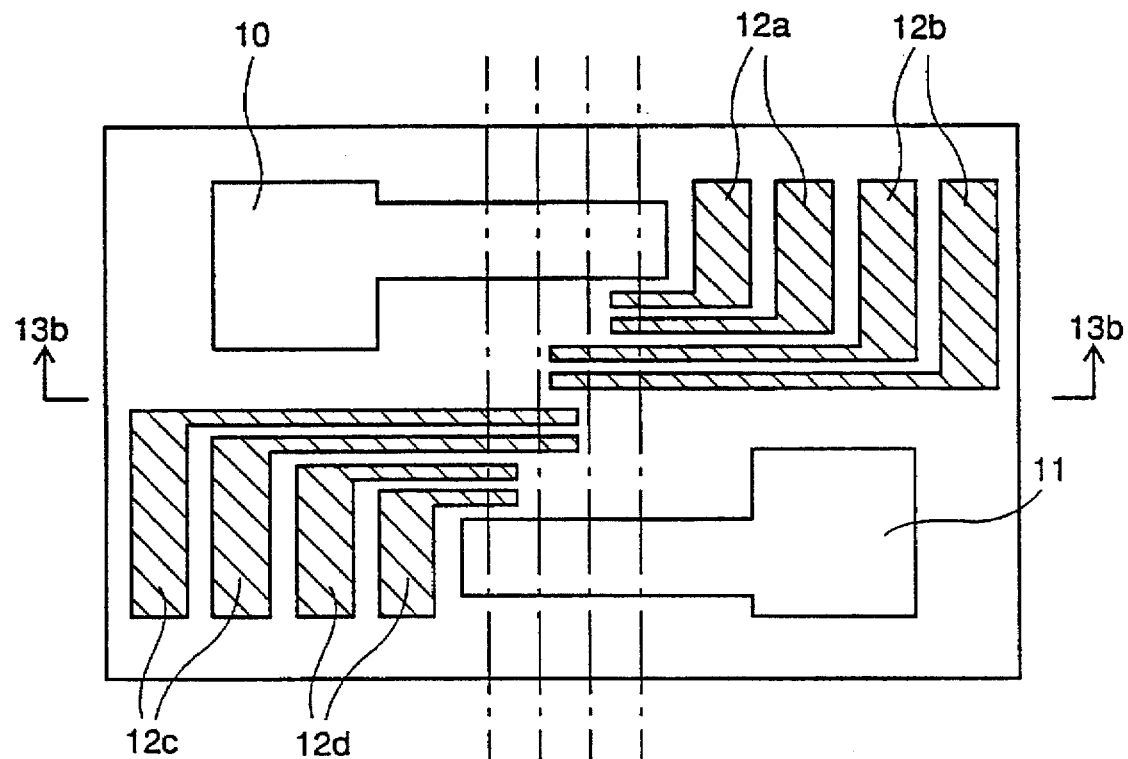
FIGS. 13(a) and 13(b) are a plan view and a cross-sectional view, respectively, of a single electron device according to a fifteenth embodiment of the present invention.
Figure 13:
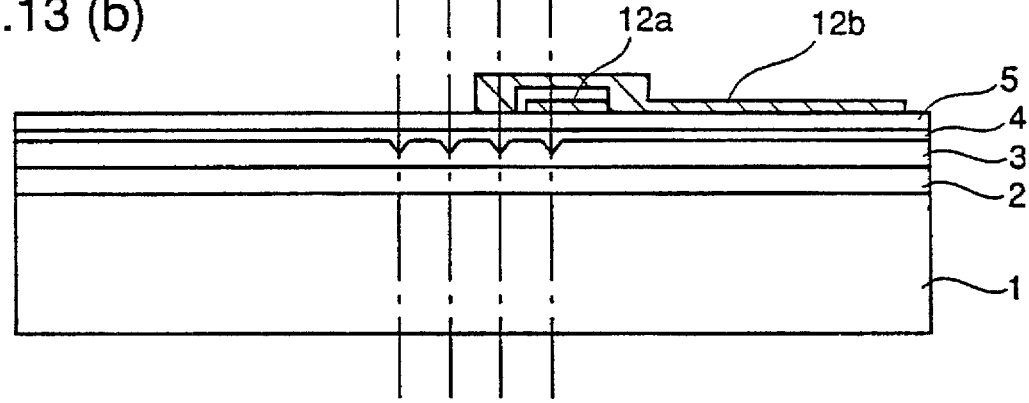

FIGS. 13(a) and 13(b) are a plan view and a cross-sectional structural view, respectively, of a single electron device according to a fifteenth embodiment of the present invention. The fifteenth embodiment is constituted by arranging gate electrodes 12a, 12b, 12c, and 12d between the source electrode 10 and the drain electrode 11 at respective channels formed by the electron storage regions 7a, 7b, 7c, and 7d so that the respective gate electrodes 12a, 12b, 12c, and 12d may turn respective channels on and off.

In this fifteenth embodiment, if it is supposed that the current value in the ON state of one of the channels 7a, 7b, 7c, and 7d is I=n$_{ef}$(A), when the two channels are turned on, the value of the flowing current becomes 2I(A), and when M channels are turned on, the value of the flowing current becomes MI(A), and thereby a current value having M stages can be transferred as an information unit.

In the single electron device of the fifteenth embodiment, since respective channels formed by electron storage regions 7a to 7d are turned on or off by the respective pair of electrodes 12a between the source electrode 10 and the drain electrode 11, by controlling the number of channels turning on or off, a single electron device that can transfer a current value having M stages as an information unit can be obtained. Further, a logic element capable of high speed operation due to its high electron mobility can be obtained.

Embodiment 16

Figure 14:
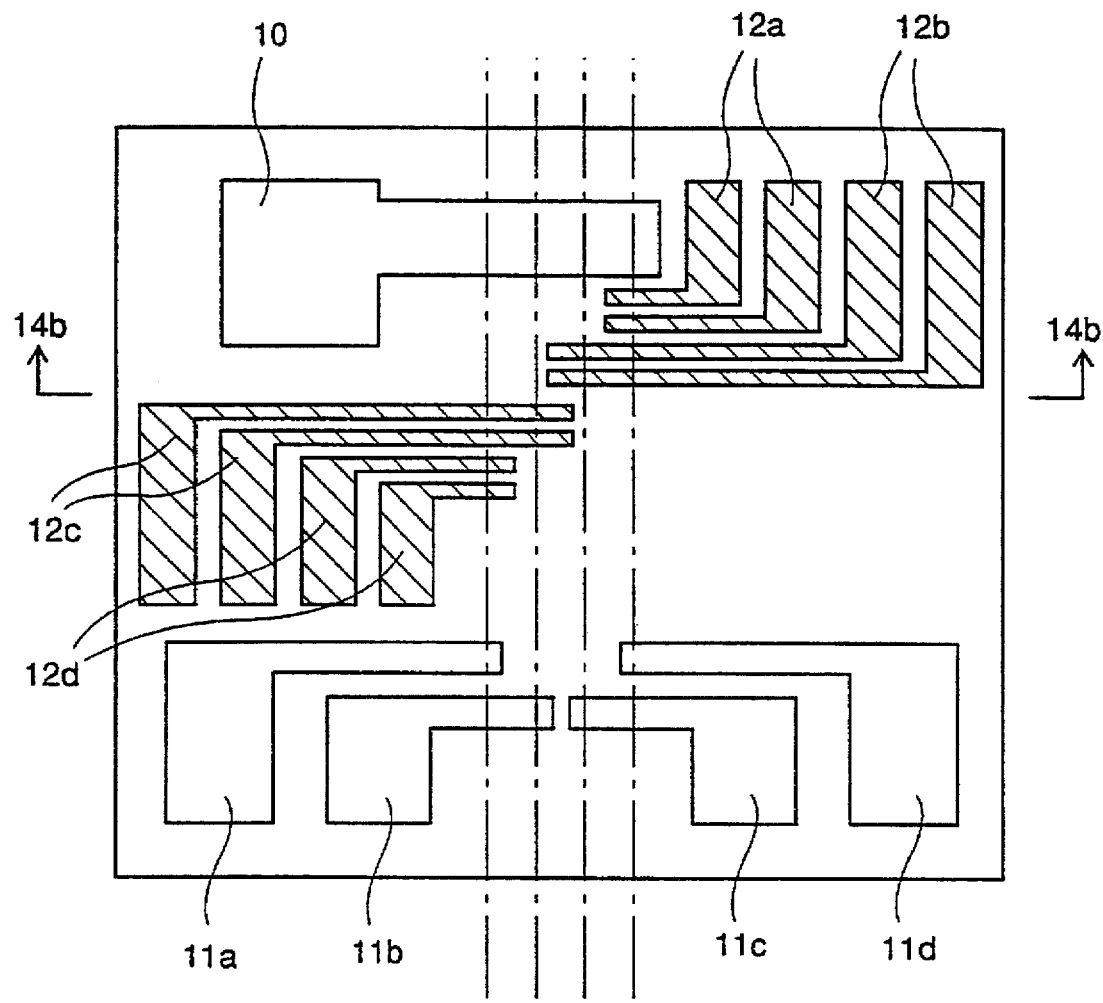
FIGS. 14(a) and 14(b) are a plan view and a cross-sectional view, respectively, of a single electron device (information transfer element) according to a sixteenth embodiment of the present invention.
Figure 14:
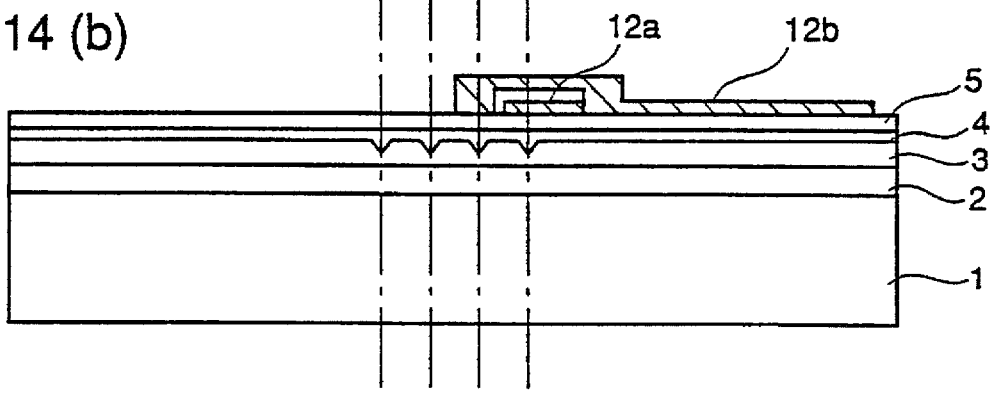

FIGS. 14(a) and 14(b) are a plan view and a cross-sectional view, respectively, of a single electron device (information transfer element) according to a sixteenth embodiment of the present invention. The sixteenth embodiment has a pair of gate electrodes 12a, 12b, 12c, and 12d, respectively, disposed at respective channels 7a, 7b, 7c, and 7d, and further provides drain electrodes 11a, 11b, 11c, and 11d, respectively, which are independently operable for respective channels.

In the sixteenth embodiment, since a pair of gate electrodes are disposed at respective channels and drain electrodes are independently operable for respective channels, information transfer using respective channels as one bit channels can be carried out. Further, a logic element capable of high speed operation due to its high electron mobility can be obtained. FIG. 14(a) illustrates a device for four bit transfer, but an information transfer element for transfer of 8 bits and 16 bits can be similarly fabricated.

Embodiment 17

Figure 15:
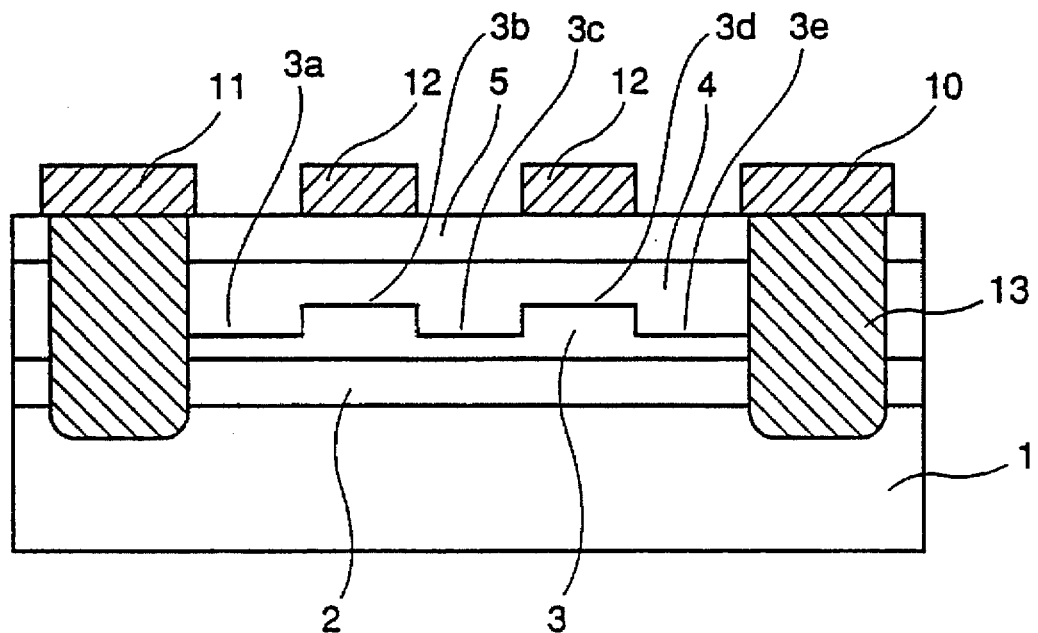
FIGS. 15(a) and 15(b) are a (0Ī1) cross-section and a (011) cross-section of a single electron device according to a seventeenth embodiment of the present invention, respectively.
Figure 15:
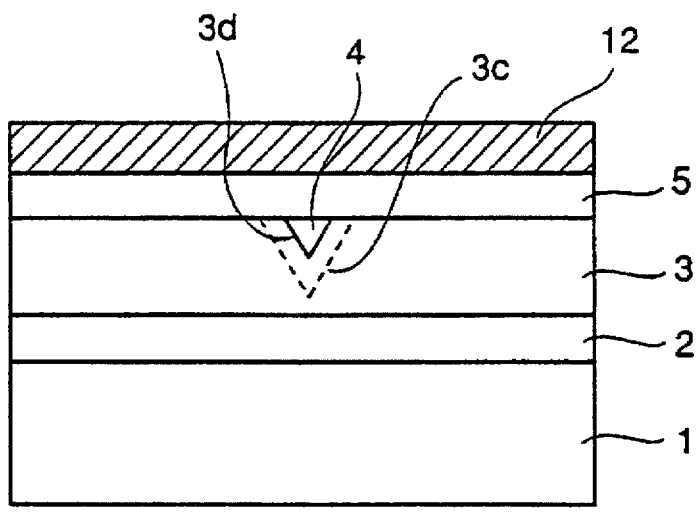
Figure 16:
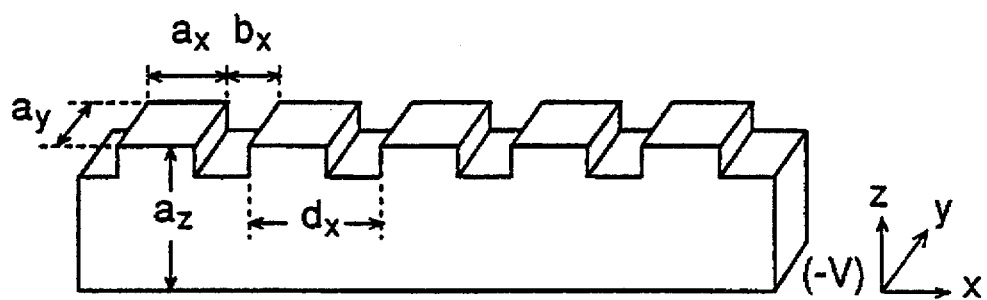
FIGS. 16(a) and 16(b) are a conceptional view illustrating a general quantum wire superlattice structure and a diagram illustrating a state density function for explaining a physical property thereof, respectively.
Figure 16:
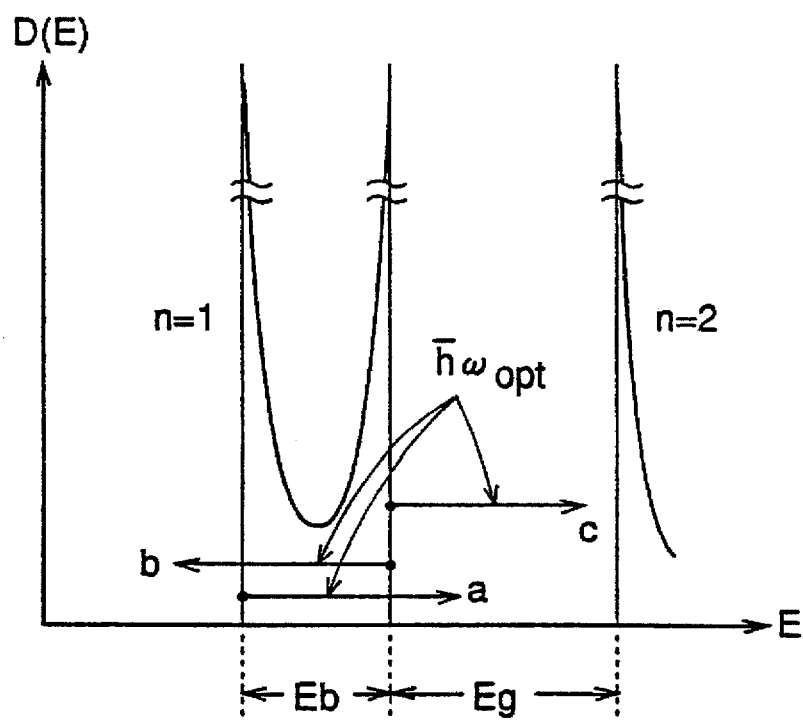
Figure 17:
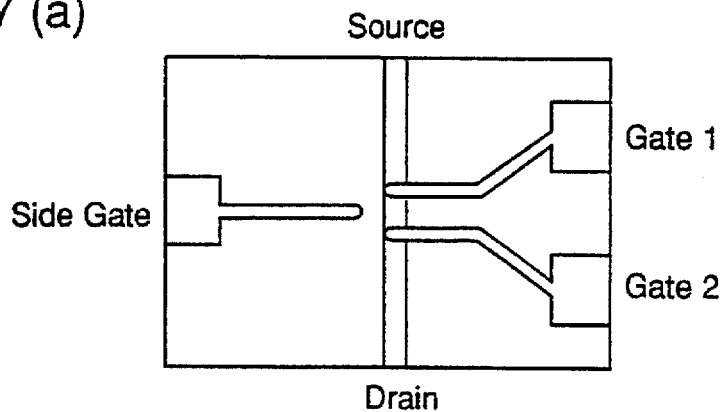
FIGS. 17(a) and 17(b) are a plan view and a perspective view, respectively, for explaining a structure of a conventional single electron device.
Figure 17:
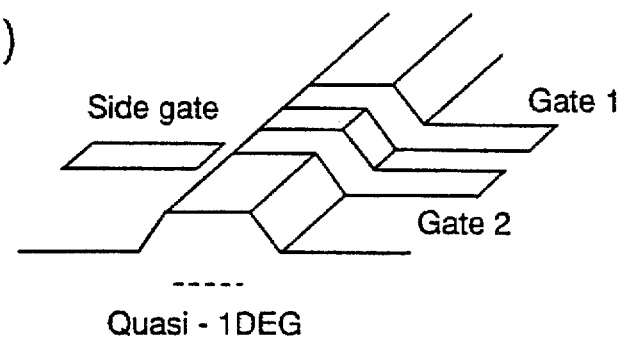
Figure 18:
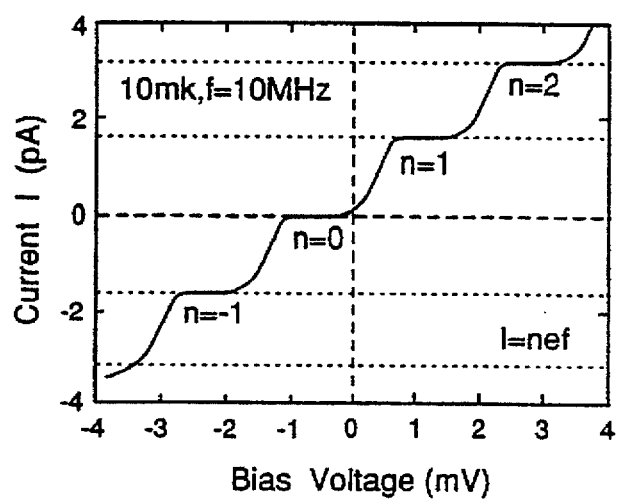
FIG. 18 is a diagram for explaining I–V characteristics of a conventional single electron device.

FIGS. 15(a) and 15(b) are a (0$\bar{1}$1) cross-section and a (011) cross-section, respectively, of a single electron device according to a seventeenth embodiment of the present invention.

The single electron device of the seventeenth embodiment is equivalent to other single electron device embodiments but has a structure comprising an undoped GaAs layer 2 and an Al$_{0.3}$Ga$_{0.3}$As spacer layer 3, an n type Al$_{0.3}$Ga$_{0.3}$As electron supply layer 4, and an n type GaAs layer 5 successively laminated on a semi-insulating GaAs substrate 1. A portion of the undoped AlGaAs spacer layer 3 is etched in a reverse triangular configuration cross-section as shown in FIG. 15(b). The depth of the concave portion periodically varies along the length direction, i.e., deep regions are provided at three portions (3a, 3c, 3e) and shallow regions are provided at two portions (3b, 3d). The AlGaAs electron supply layer 4 buries the concavo-convex periodic structure at the region opposite and between the plurality of gate electrodes 12. A source electrode 11 and a drain electrode 10 are disposed on the upper surface of the semiconductor layer structure.

According to the structure of the seventeenth embodiment, as also shown for the sixth embodiment, while the electrons are stored in a high concentration at the region (3a, 3c, 3e) of the thin spacer layer 3, few electrons are stored at the region (3b, 3d) of the thick spacer layer 3. As a result, a concentration distribution as shown in FIG. 6(b) is realized. Accordingly, under an appropriate bias voltage, the electrons in the regions between the periodic structure can be isolated, and by applying a high frequency voltage to the gate electrodes 12 in this state, a single electron device can be realized as in the twelfth embodiment.

The seventeenth embodiment realizes a function similar to the twelfth embodiment by employing the fundamental structure shown in the sixth embodiment. In this seventeenth embodiment, by constructing the device as described above, it is easily possible to achieve a narrow channel width, up to about 20 nm, and it is also possible to easily provide a multi-channel device because no side gate is required. Furthermore, the single electron device can be produced as a logic element capable of high speed operation due to its high electron mobility.

Embodiment 18

The seventeenth embodiment constitutes a function similar to the twelfth embodiment by using the fundamental structure shown in the sixth embodiment. Similarly, by employing the structure shown in the sixth embodiment, a device shown in the thirteenth to sixteenth embodiments can be constructed.

Embodiment 19

The invention described with reference to the first to eighteenth embodiments forms a quantum wire superlattice or a single electron device by introducing a periodic potential in the length direction of the quantum wire.

In Japanese Patent Published Application No. Hei. 4-199519, an example in which a structure having an undoped GaAs layer 2, an undoped AlGaAs spacer layer 3, an n type AlGaAs electron supply layer 4, and an n type GaAs layer 5 are successively laminated on a semi-insulating GaAs substrate 1, a portion of the undoped AlGaAs spacer layer 3 is etched to a reverse triangular configuration, and the n type AlGaAs electron supply layer 4 buries the reverse triangular configuration etched region. However, according to investigations conducted more recently, by employing In$_{0.15}$Ga$_{0.85}$As in place of GaAs for the channel layer, a higher electron mobility and a higher electron concentration are realized.

What is claimed is:

1. A semiconductor device comprising:
   a semi-insulating semiconductor substrate having a top and a rear surface;
   a semiconductor layer structure comprising at least an undoped layer of a first semiconductor having a top surface and a rear surface, an undoped spacer layer comprising a second semiconductor having an electron affinity smaller than that of the first semiconductor and having a top surface and a rear surface, and an n type electron supply layer comprising the second semiconductor and having a top surface and a rear surface, successively grown on the top surface of the semi-insulating semiconductor substrate, the undoped layer having a flat top surface and a flat rear surface, the undoped spacer layer having, in cross-section at the top surface, a concavo-convex periodic structure, the rear surface being a flat surface disposed on the flat top surface of the undoped spacer layer, the n-type electron supply layer having, in cross-section at the top surface, a flat surface, the rear surface burying concavities of the concavo-convex structure of the undoped spacer layer; and a plurality of periodically spaced Schottky electrodes on the flat top surface of the n type electron supply layer, arranged in a direction perpendicular to the concavo-convex periodic structure of the undoped spacer layer.

2. The semiconductor device of claim 1 wherein said semiconductor substrate is GaAs, said first semiconductor is GaAs, and said second semiconductor is AlGaAs.

3. The semiconductor device of claim 1 wherein said semiconductor substrate is GaAs, and said semiconductor layer structure comprises at least an undoped InGaAs layer, an undoped AlGaAs spacer layer, and an n type AlGaAs electron supply layer that are successively grown.

4. The semiconductor device of claim 1 wherein said semiconductor substrate is GaAs, and said semiconductor layer structure comprises at least an undoped GaAs layer, an undoped InGaAs layer, an undoped AlGaAs spacer layer, and an n type AlGaAs electron supply layer that are successively grown.

5. The semiconductor device of claim 1 wherein said semiconductor substrate is InP, said first semiconductor is InGaAs, and said second semiconductor is AiInAs.

6. The semiconductor device of claim 1 wherein said semiconductor substrate is InP, and said semiconductor layer structure comprises at least an undoped InGaAs layer, an undoped AlInAs spacer layer, and an n type AlInAs electron supply layer that are successively grown.

7. The semiconductor device of claim 1 wherein said semiconductor substrate is InP, and said semiconductor layer structure comprises at least an undoped AiInAs layer, an undoped InGaAs layer, an undoped AlInAs spacer layer, and an n type AlInAs electron supply layer that are successively grown.

8. The semiconductor device of claim 1 wherein said semiconductor substrate is InP, and said semiconductor layer structure comprises at least an undoped AlInAs layer, an undoped InGaAs layer, an undoped AiInAs spacer layer, and an n type AlInAs electron supply layer, and an undoped AlInAs cap layer that are successively grown.

9. The semiconductor device of claim 1 wherein the cross-section of said concavo-convex periodic structure of said undoped spacer layer has a triangular configuration.

10. The semiconductor device of claim 1 wherein of said concavo-convex periodic structure of said undoped spacer layer has (111)B surfaces.

11. The semiconductor device of claim 1 wherein said concavo-convex periodic structure of said undoped spacer layer has a depth that periodically varies along a length direction of said concavo-convex periodic structure.

12. A single electron device comprising:

a structure comprising at least an undoped layer of a first semiconductor, an undoped spacer layer comprising a second semiconductor having a smaller electron affinity than that of said first semiconductor, and an n type electron supply layer comprising said second semiconductor that are successively grown, portions of said undoped spacer layer having reverse triangular configurations in cross section and including at least at two points, said n-type electron supply layer burying regions of said undoped spacer layer that have reverse triangular configurations in cross section;

a plurality of gate electrodes disposed on an upper surface of said semiconductor layer structure arranged in a direction perpendicular to the reverse triangular configurations of said undoped spacer layer; and at least one electron being stored in each of the electron storage regions in said undoped layer at each edge of said reverse triangular configuration, the at least one electron being switched by an application of a voltage to a respective gate electrode, thereby operating the single electron device.

13. The single electron device of claim 12 wherein gate voltages that make an electron tunnel directly opposite said gate electrodes are applied to said gate electrodes and high frequency voltages having a phase shift of $\pi$ therebetween are respectively applied to two of said gate electrodes, thereby enabling carrying of electrons sequentially, one by one, between a source electrode and a drain electrode in respective channels comprising the electron storage regions in said undoped layer opposite edges of said reverse triangular configuration.

14. The single electron device of claim 13 wherein said gate electrodes include a first pair and a second pair of gate electrodes so that respective pairs of said gate electrodes cover all of the plurality of channels comprising the electron storage regions in said undoped layer, providing an AND logic element in which only when voltages are applied to both of said first and second pairs of gate electrodes at the same time is a path between the source electrode and the drain electrode conductive.

15. The single electron device of claim 13 wherein said gate electrodes include a first pair and a second pair of gate electrodes so that respective pairs of said gate electrodes cover respective channels of the plurality of channels comprising the electron storage regions in said undoped layer, providing an OR logic element in which when a voltage is applied to at least one of said first and second pairs of gate electrodes, a path between a respective source electrode and a respective drain electrode is conductive.

16. The single electron device of claim 13 wherein said gate electrodes include a respective pair of gate electrodes disposed at respective channels of the plurality of channels comprising the electron storage regions in said undoped layer, providing a single electron device in which a transfer of a current value between the source electrode and the drain electrode having a current equal to an integer multiple of a single bit current flows as information.

17. The single electron device of claim 13 wherein gate electrodes are disposed at respective channels comprising the electron storage regions in said undoped layer, including a plurality of drain electrodes disposed for independent operation for each of the respective channels, and said source electrode is a common electrode for said gate electrodes and said drain electrodes, providing a single electron device for information transfer employing each of the respective channels for one bit of information.

18. A single electron device comprising:

a semi-insulating semiconductor substrate having a top and a rear surface;

a semiconductor layer structure comprising at least an undoped layer of a first semiconductor having a top surface and a rear surface, an undoped spacer layer comprising a second semiconductor having an electron affinity smaller than that of said first semiconductor having a top surface and a rear surface, and an n type electron supply layer comprising said second semiconductor having a top surface and a rear surface, successively grown on the top surface of said semi-insulating substrate, portions of said undoped spacer layer having reverse triangular configurations in cross section having a depth that varies periodically along a length direction, thereby forming a plurality of shallow regions;

an n-type electron supply layer of the second semiconductor burying the reverse triangular configurations of said undoped spacer layer;

a plurality of gate electrodes disposed on an upper surface of said semiconductor layer structure, arranged in correspondence with the shallow regions in said undoped spacer layer; and a source electrode and a drain electrode disposed opposite each other with said gate electrodes between them on the upper surface of said semiconductor layer structure.

19. The single electron device of claim 12 wherein said reverse triangular configurations of said undoped spacer layer have (111)B surfaces.

20. The single electron device of claim 12 wherein said layer structure comprises at least an undoped InGaAs layer, an undoped AlGaAs spacer layer, and an n type AlGaAs electron supply layer and said semi-insulating substrate comprises GaAs.

21. The single electron device of claim 12 wherein said layer structure comprises at least an undoped GaAs layer, an undoped InGaAs layer, an undoped AlGaAs spacer layer, and an n type AlGaAs electron supply layer and said semi-insulating substrate comprises GaAs.

22. The single electron device of claim 12, wherein said structure comprises at least an undoped AlInAs layer, an undoped InGaAs layer, an undoped AlInAs spacer layer, and an n type AlInAs electron supply layer and said semi-insulating substrate comprises InP.

* * * * *

UNITED STATES PATENT AND TRADEMARK OFFICE
CERTIFICATE OF CORRECTION

PATENT NO. : 5,679,962
DATED : October 21, 1997
INVENTOR(S) : Kizuki

It is certified that error appears in the above-indentified patent and that said Letters Patent is hereby corrected as shown below:

Column 21, Line 37, change "AiInAs" to --AlInAs--;

Line 45, change "AiInAs" to --AlInAs--;

Line 52, change "AiInAs" to --AlInAs--;

Line 54, change "AIInAs" to --AlInAs--;

Line 58, delete --of--;

Column 22, Line 44, after "which" insert --,--.

Signed and Sealed this

Twenty-eighth Day of April, 1998

Attest:

BRUCE LEHMAN

*Attesting Officer*  *Commissioner of Patents and Trademarks*